[19] United States Patent
Piazza et al.

(10) Patent No.: US 8,552,621 B2
(45) Date of Patent: Oct. 8, 2013

(54) SYSTEMS AND METHODS FOR OPERATING PIEZOELECTRIC SWITCHES

(75) Inventors: Gianluca Piazza, Philadelphia, PA (US); Nipun Sinha, Philadelphia, PA (US); Timothy S. Jones, Fort Worth, TX (US); Zhijun Guo, Philadelphia, PA (US); Graham E. Wabiszewski, Philadelphia, PA (US); Robert Carpick, Philadelphia, PA (US); Andre Dehon, Philadelphia, PA (US)

(73) Assignee: The Trustees Of The University of Pennsylvania, Philadelphia, PA (US)

( * ) Notice: Subject to any disclaimer, the term of this patent is extended or adjusted under 35 U.S.C. 154(b) by 326 days.

(21) Appl. No.: 12/955,285

(22) Filed: Nov. 29, 2010

(65) Prior Publication Data

US 2011/0148251 A1    Jun. 23, 2011

Related U.S. Application Data

(60) Provisional application No. 61/265,114, filed on Nov. 30, 2009, provisional application No. 61/266,337, filed on Dec. 3, 2009.

(51) Int. Cl.
*H01L 41/09* (2006.01)
*H01H 57/00* (2006.01)

(52) U.S. Cl.
CPC ............. *H01L 41/094* (2013.01); *H01H 57/00* (2013.01); *H01H 2057/006* (2013.01)
USPC ........................................................ 310/328

(58) Field of Classification Search
CPC ... H01L 41/09; H01L 41/0933; H01L 41/094; H01H 57/00; H01H 2057/006

USPC ........................................................ 310/328
See application file for complete search history.

(56) References Cited

U.S. PATENT DOCUMENTS

2006/0226735 A1* 10/2006 Ikehashi .................... 310/311

OTHER PUBLICATIONS

Sinha et al., "Piezoelectric Aluminum Nitride Nanoelectromechanical Actuators", Applied Physics Letters 95, 2009.
Sinha, et al., "Dual-Beam Actuation of Piezoelectric ALN RF MEMS Switches Monolithically Integrated With ALN Contour-Mode Resonators", Solid-State Sensors, Actuators and Microsystems Workshop, Jun. 2008.
Mahameed et al., "Dual-Beam Actuation of Piezoelectric A1N RF MEMS Switches Monolithically Integrated With A1N Contour-Mode Resonators", Journal of Micromechanics and Microengineering 18, 2008, pp. 1-11.

* cited by examiner

*Primary Examiner* — Derek Rosenau
(74) *Attorney, Agent, or Firm* — RatnerPrestia

(57) ABSTRACT

Systems and methods for operating piezoelectric switches are disclosed. A piezoelectric switching system includes a first actuator, a second actuator, and a bias voltage source. The first actuator has a first body electrode, a first gate electrode, and a first contact region. The second actuator has a second body electrode, a second gate electrode, and a second contact region. The first and second contact regions are separated by a gap. The bias voltage source applies a bias voltage to the body electrodes. The bias voltage is lower in magnitude than an actuation voltage for the switch. The gate electrodes receive a switching voltage. The switching voltage causes at least one of the first and second actuators to bend, thereby closing the gap such that the second contact region electrically contacts the first contact region. The difference between the switching voltage and the bias voltage exceeds the actuation voltage of the switch.

7 Claims, 20 Drawing Sheets

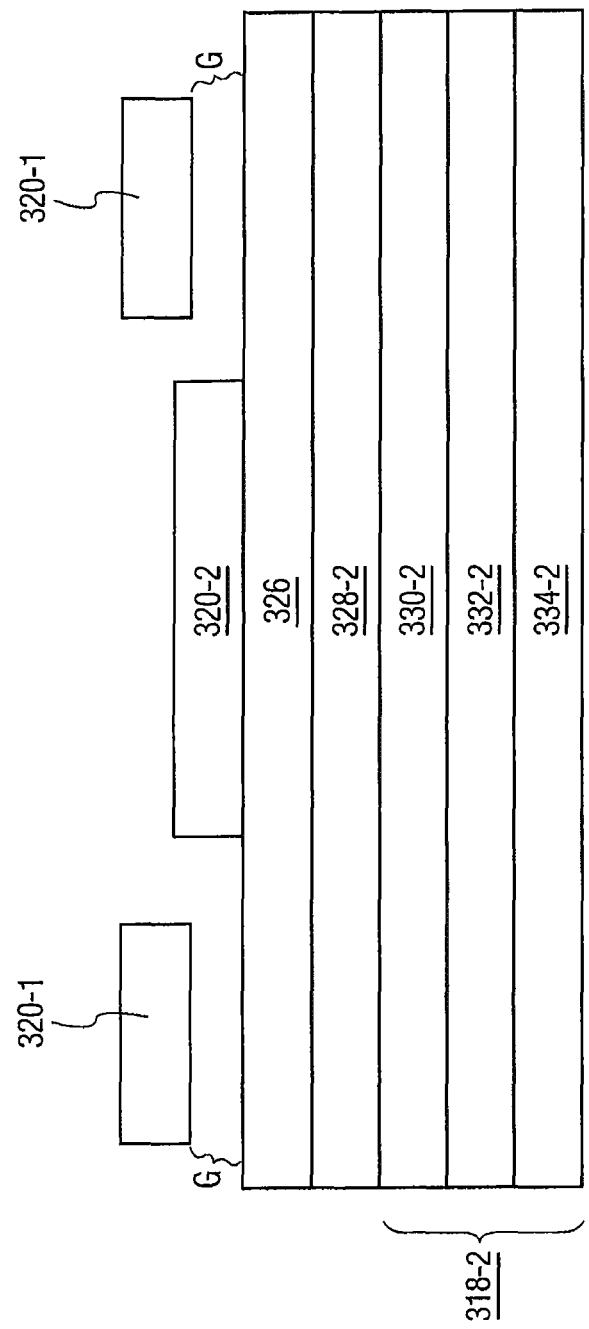

SYSTEMS AND METHODS FOR OPERATING PIEZOELECTRIC SWITCHES

CROSS-REFERENCE TO RELATED APPLICATIONS

This application claims priority to U.S. patent application No. 61/265,114, filed Nov. 30, 2009, and U.S. patent application No. 61/266,337, filed Dec. 3, 2009, the contents of which are incorporated by reference herein.

STATEMENT REGARDING FEDERALLY SPONSORED RESEARCH

The present invention was supported in part by a grant from Defense Advanced Research Projects Agency (DARPA) (Grant No. W911QX-06-C-0097). The United States Government may have certain rights to the disclosed invention.

FIELD OF THE INVENTION

The present invention relates to piezoelectric devices, and more particularly, to systems and methods for operating piezoelectric switches.

BACKGROUND OF THE INVENTION

Electronic systems typically use switches for routing electrical signals. Categories of switches include semiconductor-based switches and microelectromechanical system (MEMS) or nanoelectromechanical system (NEMS) switches.

Semiconductor-based switches generally include a semiconductor channel that isolates one side of the switch from the other. To overcome this isolation, a sufficiently high voltage is applied across the semiconductor channel. Semiconductor switches may suffer from high sub-threshold power consumption. This means that power may be dissipated across the switch even though it is off, i.e., the voltage across the switch is below the threshold voltage level necessary to turn the switch on. This is because the semiconductor channel is always present, physically linking both sides of the switch.

One common type of MEMS or NEMS switch includes piezoelectric switches. Piezoelectric switches generally include an air gap that electrically isolates one side of the switch from the other. To actuate a piezoelectric switch, a voltage is applied to the piezoelectric material of the switch, which causes the material to contort in shape, thereby closing the air gap.

There is an ever-present desire for improved switches.

SUMMARY OF THE INVENTION

The present invention is embodied in systems and methods for operating piezoelectric switches. According to an aspect of the present invention, a method for operating a piezoelectric switch is disclosed. The piezoelectric switch comprises a first actuator including a first body electrode, a first gate electrode, and a first contact region, and a second actuator including a second body electrode, a second gate electrode, and a second contact region. The first and second contact regions are separated by a gap. The method includes the step of applying a bias voltage to the first and second body electrodes. The bias voltage is lower in magnitude than an actuation voltage for the piezoelectric switch. The method further includes the step of receiving a switching voltage at the first and second gate electrodes. The switching voltage causes at least one of the first and second actuators to bend, thereby closing the gap such that the second contact region electrically contacts the first contact region. The difference between the switching voltage and the bias voltage exceeds the actuation voltage of the switch.

According to another aspect of the present invention, a piezoelectric switching system is disclosed. The system includes a first actuator, a second actuator, and a bias voltage source. The first actuator has a first body electrode, a first gate electrode, and a first contact region. The second actuator has a second body electrode, a second gate electrode, and a second contact region. The first and second contact regions are separated by a gap. The bias voltage source is for applying a bias voltage to the first and second body electrodes. The bias voltage is lower in magnitude than an actuation voltage for the first and second actuators. At least one of the first and second actuators is configured to bend upon application of a switching voltage to the first and second gate electrodes, thereby closing the gap such that the second contact region electrically contacts the first contact region. The difference between the switching voltage and the bias voltage exceeds the actuation voltage of the switching system.

According to yet another aspect of the present invention, a piezoelectric switching system is disclosed. The system includes a first actuator, a second actuator, and a bias voltage source. The first actuator has a body electrode, a pair of gate electrodes sandwiching the body electrode, a layer of piezoelectric material between each of the gate electrodes and the body electrode, a contact region insulated from the body and gate electrodes, and a source electrode in electrical contact with the contact region. The second actuator has a gate electrode, a pair of body electrodes sandwiching the gate electrode, a layer of piezoelectric material between each of the body electrodes and the gate electrode, a projection insulated from the body and gate electrodes, the projection separated from the contact region by a gap, and a drain electrode in electrical contact with the projection. The bias voltage source is for applying a bias voltage to the body electrodes of the first and second actuators. The bias voltage is lower in magnitude than an actuation voltage for the first and second actuators. The bias voltage causes at least one of the first and second actuators to bend, thereby narrowing the gap between the projection and the contact region. At least one of the first and second actuators is configured to further bend upon application of a switching voltage to the gate electrodes, thereby closing the gap such that the projection of the second actuator electrically contacts the contact region of the first actuator. The difference between the switching voltage and the bias voltage exceeds the actuation voltage of the switching system.

According to still another aspect of the present invention, a logic element is disclosed. The logic element includes an array of piezoelectric switches and one or more bias voltage sources. The array of piezoelectric switches are arranged on a substrate. Each switch comprises a first actuator including a first body electrode, a first gate electrode, and a first contact region, and a second actuator including a second body electrode, a second gate electrode, and a second contact region. The first and second contact regions separated by a gap. The one or more bias voltage sources apply a bias voltage to the body electrodes of each of the piezoelectric switches to electrically configure each switch as either a positive-actuated switch or a negative-actuated switch.

BRIEF DESCRIPTION OF THE DRAWINGS

The invention is best understood from the following detailed description when read in connection with the accompanying drawings, with like elements having the same reference numerals. When a plurality of similar elements are present, a single reference numeral may be assigned to the plurality of similar elements followed by a dash and a separate numeric designation referring to specific elements. When referring to the elements collectively or to a non-specific one or more of the elements, the dash and numeric designation may be dropped. This emphasizes that according to common practice, the various features of the drawings are not drawn to scale. On the contrary, the dimensions of the various features are arbitrarily expanded or reduced for clarity. Included in the drawings are the following figures:

FIG. 3C is a cross-section diagram of the portion of the piezoelectric switch shown in FIG. 3B, along lines B, B';

DETAILED DESCRIPTION OF THE INVENTION

FIGS. 12-15 illustrate aspects of the present invention relating to exemplary piezoelectric switching systems and exemplary methods of operating piezoelectric switches.

Figure 12:
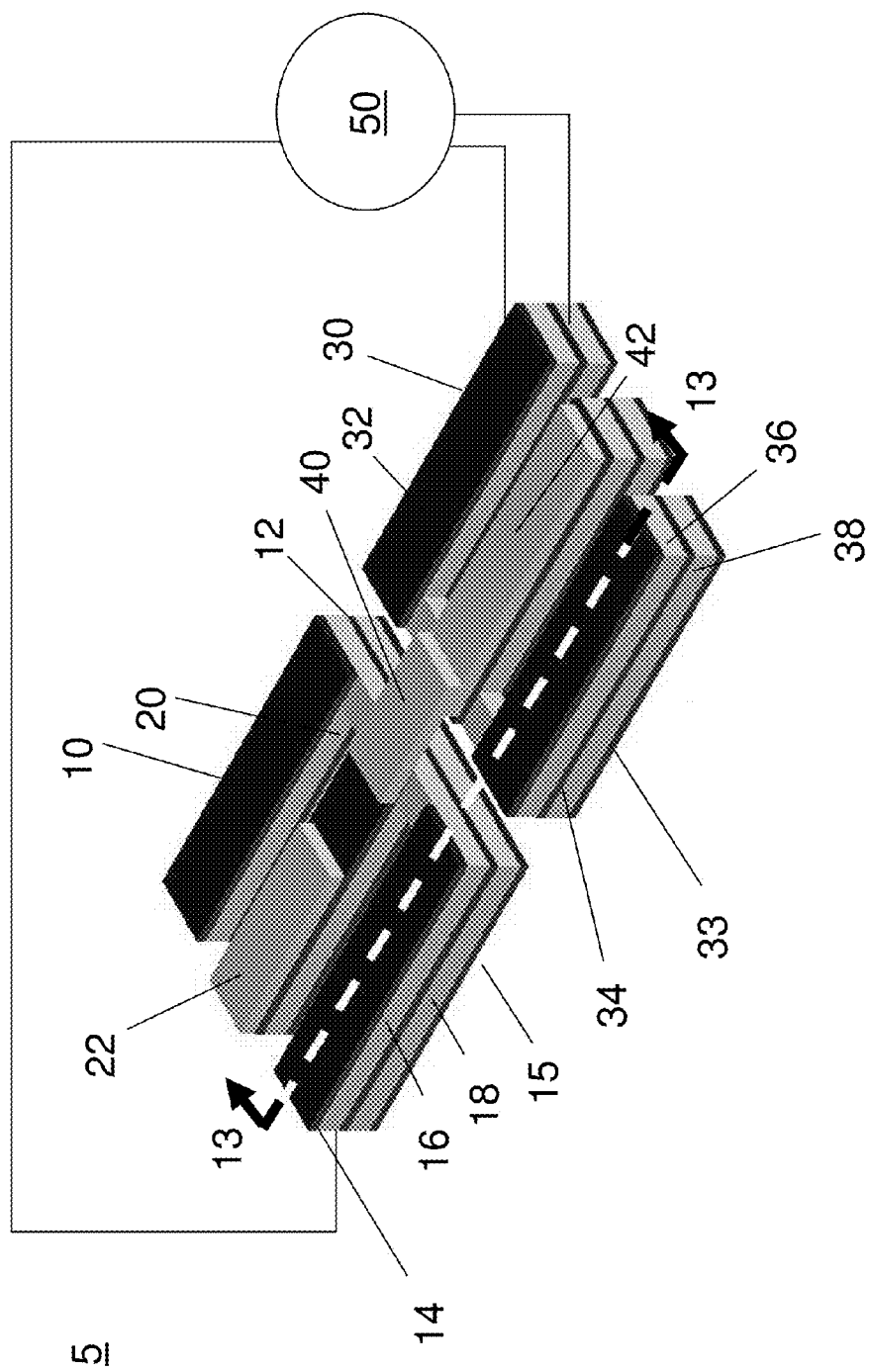
FIG. 12 is a perspective diagram of an exemplary piezoelectric switching system in accordance with an aspect of the present invention.
Figure 13:
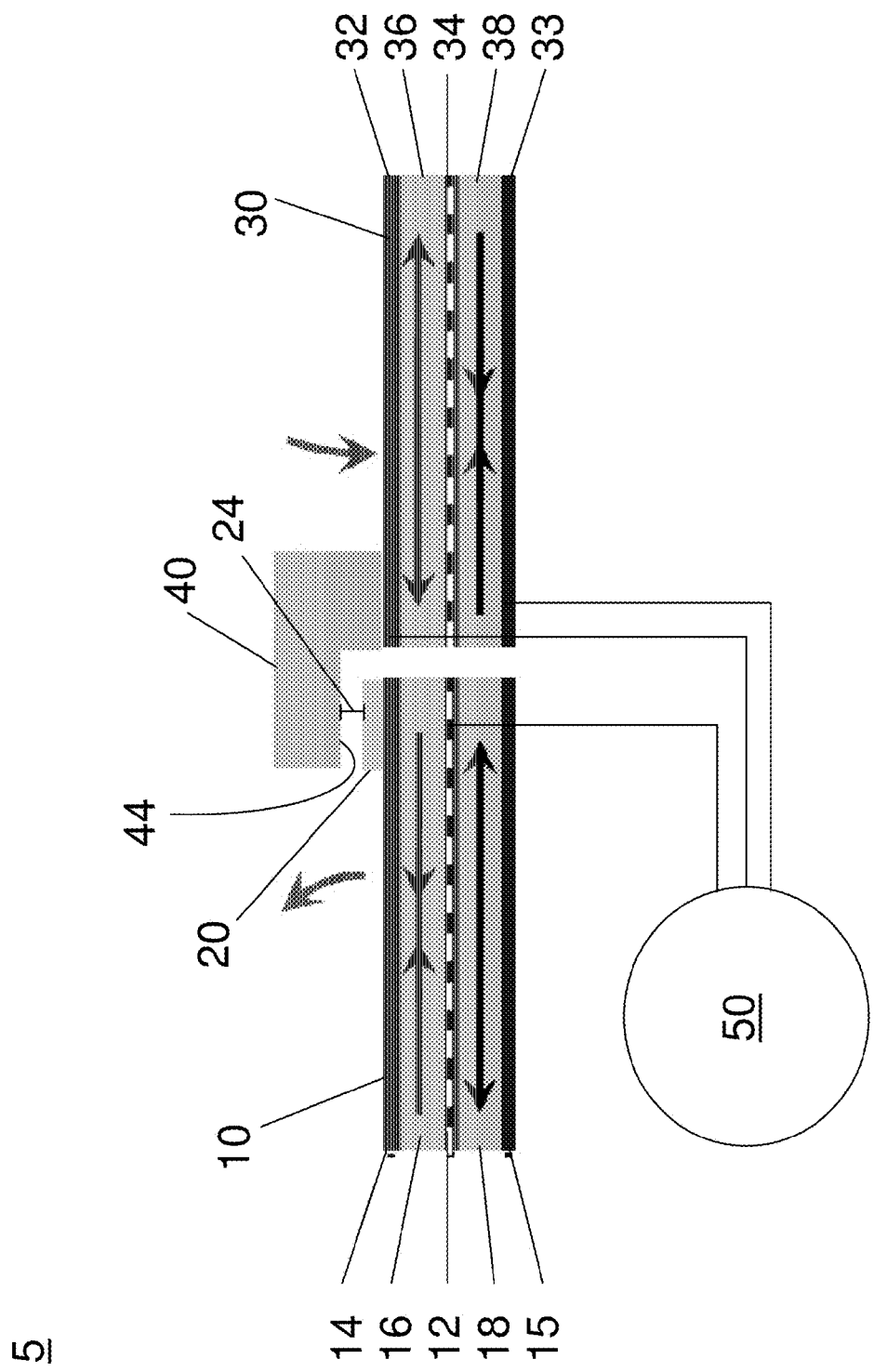
FIG. 13 is a cross-sectional diagram of the piezoelectric switching system of FIG. 12 along line 13-13.

FIGS. 12 and 13 depict an exemplary piezoelectric switching system 5 in accordance with one aspect of the present invention. As a general overview, piezoelectric switching system 5 includes a first actuator 10, a second actuator 30, and a bias voltage source 50. First and second actuators 10 and 30 may desirably be cantilever beam actuators. First and second actuators 10 and 30 may be coupled to a substrate (not shown) such that a portion of actuators 10 and 30 is suspended from the substrate, allowing actuators 10 and 30 to bend. The illustrated embodiment will now be described below in further detail.

First actuator 10 includes body electrode 12, a pair of gate electrodes 14 and 15, layers of piezoelectric material 16 and 18, and contact region 20.

Body electrode 12 is coupled to a bias voltage source 50. In an exemplary embodiment, body electrode 12 is a layer of conductive material that receives a bias voltage from bias voltage source 50. It is understood that any conductive material may be used for body electrode 12, provided that the conductive material satisfies desired material compatibility with piezoelectric layers 16 and 18 (e.g., adhesion, formation of deleterious phases with piezoelectric layers 16 and 18, or a quality of piezoelectric layers 16 and 18 that may be deposited thereto). Suitable materials for body electrode 12 may include, but are not limited to, platinum, gold, iridium, ruthenium, molybdenum, titanium, rhodium, tungsten, copper, chromium, aluminum, or any combination thereof.

Gate electrodes 14 and 15 are configured to receive a switching voltage. In an exemplary embodiment, gate electrodes 14 and 15 receive a switching voltage from a switching voltage source (not shown). Gate electrodes 14 and 15 may sandwich body electrode 12. As illustrated in FIG. 13, gate electrodes 14 and 15 may be layers of conductive material. Gate electrodes 14 and 15 may include any of the conductive materials discussed above with respect to body electrode 12.

Piezoelectric material layers 16 and 18 are positioned between body electrode 12 and respective gate electrodes 14 and 15. Any suitable piezoelectric material may be used for piezoelectric material layers 16 and 18 such as, for example, aluminum nitride, zinc oxide, lead zirconate titanate (PZT), gallium arsenide, aluminum gallium arsenide or any combination thereof. Piezoelectric material layers 16 and 18 are selected such that they change shape (e.g., expand or contract) in a particular manner in response to receiving a voltage differential between body electrode 12 and respective gate electrodes 14 and 15. As illustrated by arrows in FIG. 13, application of a voltage differential may cause piezoelectric material layer 18 to expand, while causing piezoelectric material layer 16 to contract. This causes first actuator 10 to bend upward.

Contact region 20 is formed on an external surface of first actuator 10. In an exemplary embodiment, contact region 20 of first actuator 10 is separated from projection 40 of second actuator 30 by an air gap 24, as illustrated in FIG. 13. Contact region 20 may be a pad of conductive material. Contact region 20 may include any of the conductive materials discussed above with respect to body electrode 12.

First actuator 10 may further include a source electrode 22. Source electrode 22 is configured to receive an electrical signal. In an exemplary embodiment, source electrode 22 receives an electrical signal for transmission through piezoelectric switching system 5. The electrical signal may be a radio-frequency (RF) signal. Source electrode 22 is in electrical contact with contact region 20. Thereby, the electrical signal received by source electrode 22 may be transmitted to second actuator 30 when switching system 5 is actuated. Source electrode 22 may be formed from conductive material. Source electrode 22 may include any of the conductive materials discussed above with respect to body electrode 12.

Second actuator 30 includes a pair of body electrodes 32 and 33, gate electrode 34, layers of piezoelectric material 36 and 38, and projection 40.

Body electrodes 32 and 33 are coupled to bias voltage source 50. In an exemplary embodiment, body electrodes 32 and 33 receive a bias voltage from bias voltage source 50. Body electrodes 32 and 33 may be layers of conductive material. Body electrodes 32 and 33 may include any of the conductive materials discussed above with respect to body electrode 12.

Gate electrode 34 is configured to receive the switching voltage. In an exemplary embodiment, gate electrode 34 receives a switching voltage from the switching voltage source. Gate electrode 34 is sandwiched between body electrodes 32 and 33. As illustrated in FIG. 13, gate electrode 34 may be a layer of conductive material. Gate electrode 34 may include any of the conductive materials discussed above with respect to body electrode 12.

Piezoelectric material layers 36 and 38 are positioned between respective body electrodes 32 and 33 and gate electrode 34. Piezoelectric material layers 36 and 38 may include any of the piezoelectric materials discussed above with respect to piezoelectric material layers 16 and 18. Piezoelectric material layers 36 and 38 are configured to change shape, as discussed above with respect to piezoelectric material layers 16 and 18. As illustrated by arrows in FIG. 13, application of a voltage differential may cause piezoelectric material layer 38 to contract, while causing piezoelectric material layer 36 to expand. This causes first actuator 10 to bend downward.

Projection 40 is formed on an external surface of second actuator 30. In an exemplary embodiment, projection 40 of second actuator 30 is separated from contact region 20 of first actuator 10 by air gap 24. Projection 40 may form a second contact region 44 that overlaps first actuator 10 in the area of contact region 20 to form the air gap 24. While contact region 44 is formed on projection 40, it will be understood that contact region 44 can be formed directly on second actuator 30, similarly to contact region 20 of first actuator 10. The air gap 24 between the first and second contact regions 20 and 44 may be between about 100 nm to about 3,000 nm, and may desirably be about 200 nm. The air gap 24 provides electrical insulation between contact region 20 and projection 40, and thereby provides electrical insulation between first and second actuators 10 and 30. Projection 40 is formed from conductive material. Projection 40 may include any of the conductive materials discussed above with respect to body electrode 12.

Second actuator 30 may further include a drain electrode 42. Source electrode 22 is configured to receive an electrical signal. In an exemplary embodiment, drain electrode 42 outputs the electrical signal received through piezoelectric switching system 5. The electrical signal may be a radio-frequency (RF) signal. Drain electrode 42 is in electrical contact with projection 40. Thereby, when switching system 5 is actuated, an electrical connection may be formed between source electrode 22 and drain electrode 42 such that an electrical signal received by source electrode 22 is transmitted to drain electrode 42. Drain electrode 42 may be formed from conductive material. Drain electrode 42 may include any of the conductive materials discussed above with respect to body electrode 12.

Although first and second actuators 10 and 30 are illustrated as collinear, it is contemplated that actuators 10 and 30 may be positioned at an angle with respect to each other. Additionally, although FIGS. 12 and 13 illustrate source electrode 22 on first actuator 10 and drain electrode 42 on second actuator 30, it will be understood that source electrode 22 may be disposed on second actuator 30 and drain electrode 42 may be disposed on first actuator 10. Also, it will be understood that more than one contact region 20 and more than one projection 40 may be provided on actuators 10 and 30.

Further, it will be understood that body electrodes and gate electrodes are interchangeable, such that the bias voltage may be applied to gate electrodes 14, 15, and 34 instead of body electrodes 12, 32, and 33, as will be described herein. In such a configuration, the body electrodes 12, 32, and 33 will receive the switching voltage. However, for the purposes of clarity in describing the switching systems disclosed in this application, the electrodes receiving a bias voltage will herein all be described as body electrodes, and the electrodes receiving a switching voltage will herein all be described as gate electrodes.

Furthermore, although actuators 10 and 30 are illustrated as bimorph piezoelectric actuators, it will be understood that actuators 10 and 30 may be unimorph piezoelectric actuators. As unimorph actuators, it will be understood that each actuator 10 and 30 will include only a single body and gate electrode, with a single piezoelectric material layer disposed between them. For example, as unimorph actuators, first actuator 10 may omit gate electrode 15 and piezoelectric material layer 18, and second actuator 30 may omit body electrode 33 and piezoelectric material layer 38.

Bias voltage source 50 applies a bias to the body electrodes. In an exemplary embodiment, bias voltage source 50 provides a DC bias voltage to body electrodes 12, 32, and 33. The bias voltage is desirably less than an actuation voltage for the piezoelectric switching system 5, as will be described herein. Suitable bias voltage sources 50 will be understood by one of ordinary skill in the art from the description herein.

Figure 14:
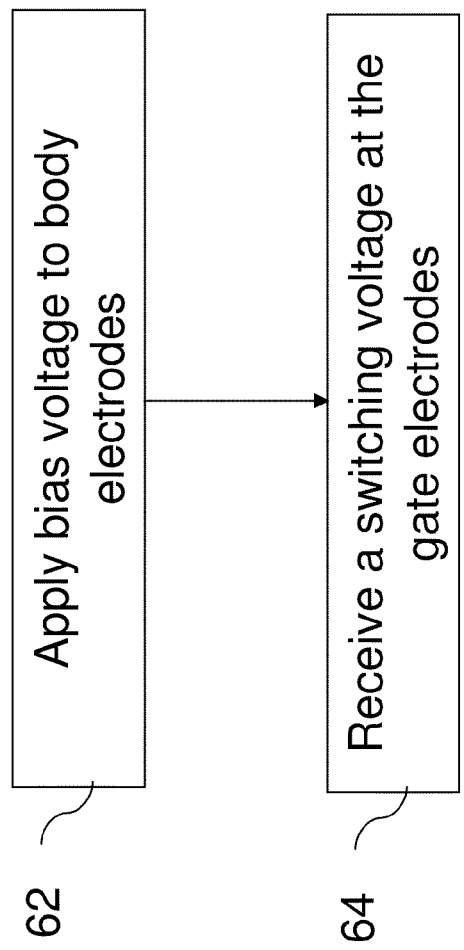
FIG. 14 is a flowchart of exemplary steps for operating a piezoelectric switch in accordance with an aspect of the present invention.

FIG. 14 is a flow chart 60 depicting exemplary steps for operating a piezoelectric switch in accordance with an aspect of the invention. To facilitate description, the steps of FIG. 14 are described with reference to the system components of FIGS. 12 and 13. It will be understood by one of skill in the art from the description herein that one or more steps may be omitted and/or different components may be utilized without departing from the spirit and scope of the present invention.

In step 62, a bias voltage is applied to the body electrodes of the piezoelectric switch. In an exemplary embodiment, bias voltage source 50 applies a bias voltage to body electrodes 12, 32, and 33. The bias voltage is greater than zero, and is desirably lower in magnitude than the actuation voltage of the piezoelectric switch. The bias voltage is also desirably opposite in polarity with respect to the actuation voltage of the piezoelectric switch (i.e., the voltage at which the piezoelectric switch actuates). A brief explanation of the actuation of the piezoelectric switch is provided.

The piezoelectric switch has an actuation voltage, which corresponds to a predetermined voltage differential between the gate electrodes 14, 15, and 34 and the body electrodes 12, 32, and 33 of the switch. At the actuation voltage, the layers of piezoelectric material 16, 18, 36, and 38 will change shape. As illustrated by arrows in FIG. 13, application of the actuation voltage differential causes piezoelectric material layers 18 and 36 to expand, while causing piezoelectric material layers 16 and 38 to contract. This causes first actuator 10 to bend upward, and second actuator 30 to bend downward. Because first actuator 10 bends upward and second actuator 30 bends downward, the contact region 44 of projection 40 comes into contact with the contact region 20 of the first actuator 10, thereby closing switching system 5. Below this actuation voltage, no contact is formed between projection 40 and contact region 20, and switching system 5 is not closed.

Because the bias voltage is desirably lower in magnitude than the actuation voltage of the switch, application of the bias voltage to body electrodes 12, 32, and 33 does not cause projection 40 to make contact with contact region 20. However, application of the bias voltage by bias voltage source 50 may cause one or both of first and second actuators 10 and 30 to bend, thereby narrowing the gap 24 between the projection 40 and the contact region 20. By pre-bending actuators 10 and 30 and narrowing the gap 24, piezoelectric switching system 5 may be actuated more quickly, and with a lower switching voltage, as described below.

In step 64, a switching voltage is received at the gate electrodes. In an exemplary embodiment, gate electrodes 14, 15, and 34 receive a switching voltage. The switching voltage is determined based on the actuation voltage of the piezoelectric switch and the bias voltage supplied by bias voltage source 50, as described herein. Because application of the bias voltage pre-bends one or both of the actuators 10 and 30, a low level switching voltage may be utilized to open and close the switching system 5.

For example, the actuation voltage of the piezoelectric switch may be 10 volts. The bias voltage source may apply a voltage of −9.5 volts to body electrodes 12, 32, 33. The switching voltage is determined such that the difference between the switching voltage and the bias voltage exceeds the actuation voltage of the piezoelectric switch. Thus, the switching voltage may be selected to be 1 volt. In this example, the total differential between the bias voltage applied to the body electrodes and the switching voltage received by the gate electrodes is 10.5 volts. Because this exceeds the actuation voltage differential, application of the switching voltage will actuate the switch, causing one or both of first and second actuators 10 and 30 to bend further, similar to as described above. This will close the gap 24 between projection 40 and contact region 20.

The switching voltage required can be tailored to whatever value is desired by adjusting the bias voltage supplied by bias voltage source 50. Further, the switching voltage can be made positive or negative by adjusting the polarity of the bias voltage supplied by bias voltage source 50.

It may be desirable to minimize the power that is consumed in actuating switching system 5. The switching power consumption is determined in part by the switching voltage required to actuate switching system 5. Accordingly, it may be desirable to minimize the required switching voltage. Switching system 5 enables this by applying the bias voltage from bias voltage source 50 to body electrodes 12, 32, and 33, thereby pre-bending first and second actuators 10 and 30. This lowers the magnitude of the switching voltage that must be received by gate electrodes 14, 15, and 34 in order to create the necessary voltage differential across the piezoelectric material layers 16, 18, 36, and 38. This pre-bending further enables switching system 5 to actuate, or switch on, very quickly. Piezoelectric switching system 5 may be able to switch on in less than 1 μs, and more particularly, in approximately 220 nanoseconds or less.

Thus, the required switching voltage for actuating switching system 5 will be desirably much less than the actuation voltage of the system. In an exemplary embodiment, the bias voltage may be only slightly lower in magnitude than the actuation voltage of the system. This may enable very low switching voltages, e.g., between approximately 100 μV to 500 mV. This in turn enables a low switching power consumption, e.g., a switching energy of a few hundred aJ (lower than state of the art CMOS).

Piezoelectric switching system 5 is particularly suitable for operation at very low switching voltages because the system 5 has a very low sub-threshold power consumption. Unlike semiconductor switches, piezoelectric switching system 5 has no physical connection between first actuator 10 and second actuator 30 when the switch is not actuated. Thus, the switching voltage required to actuate switching system 5 can be minimized, without the concern for sub-threshold power consumption that may be required for semiconductor switches.

Further, piezoelectric switching systems 5 may be configured to actuate with a positive switching voltage (positive-actuated) or to actuate with a negative switching voltage (negative-actuated) without changing the structure or fabrication of the piezoelectric switch. In order to change the disclosed piezoelectric switching system 5 from positive-actuated type to a negative-actuated type, or vice versa, the bias voltage source 50 must be (1) reversed in polarity; and (2) applied to the opposite electrodes (e.g., the gate electrodes instead of the body electrodes). Thus, in a reversed configuration, the body electrodes would receive the switching voltage required to actuate switching system 5, while the gate electrodes would receive the bias voltage. Thus, positive-actuated switching systems and negative-actuated switching systems may be fabricated from the same piezoelectric switch merely by reversing the polarity and connections of bias voltage source 50.

Figure 15:
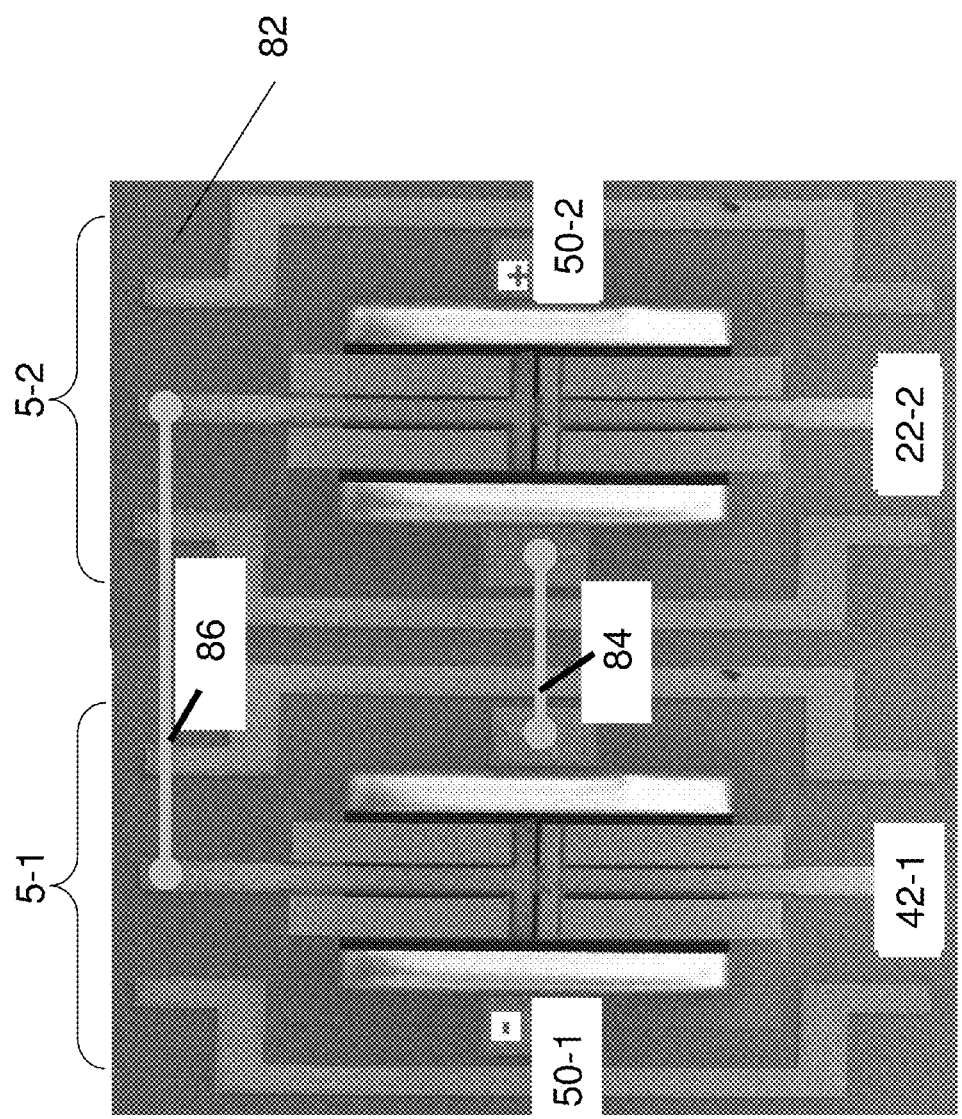
FIG. 15 is a diagram of an exemplary logic element employing the piezoelectric switching system of FIG. 12.

FIG. 15 depicts an exemplary logic element 80 in accordance with aspects of the present invention. Logic element 80 is an inverter gate. Additional details of logic element 80 are described below.

Logic element 80 comprises a pair of switching systems 5-1 and 5-2 arrayed on a substrate 82. While only two switching systems are illustrated, it will be understood that a plurality of switching systems 5-n that are structurally identical but configurable through the bias voltages may be arrayed on a single substrate to accomplish the desired logic functions. Switching system 5-1 is a positive-actuated switching system, while system 5-2 is a negative-actuated switching system. Thus, logic element 80 may include an array having both positive-actuated types and negative-actuated types of switching systems. Because systems 5-1 and 5-2 are different types, each system includes a different bias voltage source 50-1 and 50-2 for applying the bias voltage to the respective body electrodes. However, it will be understood that two or more switching systems arrayed on a substrate having the same type may share a common bias voltage source 50. Further, positive-actuated system 5-1 includes a drain electrode 42-1, while negative-actuated system 5-2 includes a source electrode 22-2, for providing signals through systems 5-1 and 5-2, respectively.

Logic element 80 includes an input 84 and an output 86. The input 84 comprises a switching voltage source, such that the input voltage causes one of piezoelectric switching systems 5-1 and 5-2 to actuate based on whether it is positive or negative. As illustrated, arrays of switching systems may have a common source of switching voltage. The input 84 provides a switching voltage to the gate electrodes (not shown) of both systems 5-1 and 5-2. The switching voltage provided by input 84 may be configured to periodically switch from positive to negative, to selectively actuate switching system 5-1 and 5-2, respectively.

When positive-actuated switching system 5-1 is actuated, it will provide a negative voltage to output 86 from drain electrode 42-1. When negative-actuated switching system 5-2 is actuated, it will provide a positive voltage to output 86 from source electrode 22-2. Thus, because logic element 80 is an inverter, the output 86 will provide an inversion of the switching voltage provided by input 84. It will be understood that output 86 may provide any desirable output voltage based on the desired logic function of logic element 80.

It will be understood by one of ordinary skill in the art from the description herein that arrays of switching systems 5 may be configured to form logic elements such as, for example, inverters, NAND gates, NOR gates, or any other logic elements. Formation and design of logic elements on a substrate using an array of positive-actuated and/or negative-actuated piezoelectric switching systems 5 will be understood to one of ordinary skill in the art from the description herein.

A suitable piezoelectric switch that may be modified in a manner that will be understood by one of ordinary skill in the art from the description herein for use in the exemplary systems and methods described herein is disclosed in Patent Cooperation Treaty application PCT/US2009/045815 to Piazza et al., entitled "Piezoelectric AlN RF MEM Switches Monolithically Integrated with AlN Contour-Mode Resonators," which is incorporated fully herein by reference, and is described below.

The piezoelectric switch includes first and second cantilever beam actuators that each include a piezoelectric actuation layer. The second cantilever beam actuator includes a projection that overlaps the first cantilever beam actuator in a contact region. The projection is mechanically separated from the first cantilever beam actuator by a nanogap such that the first and second cantilever beam actuators are electrically isolated from each other. Another aspect of the present invention is the method of forming a semiconductor chip including CM piezoelectric transducers that are monolithically integrated with dual-beam piezoelectric switches.

Figure 1A:
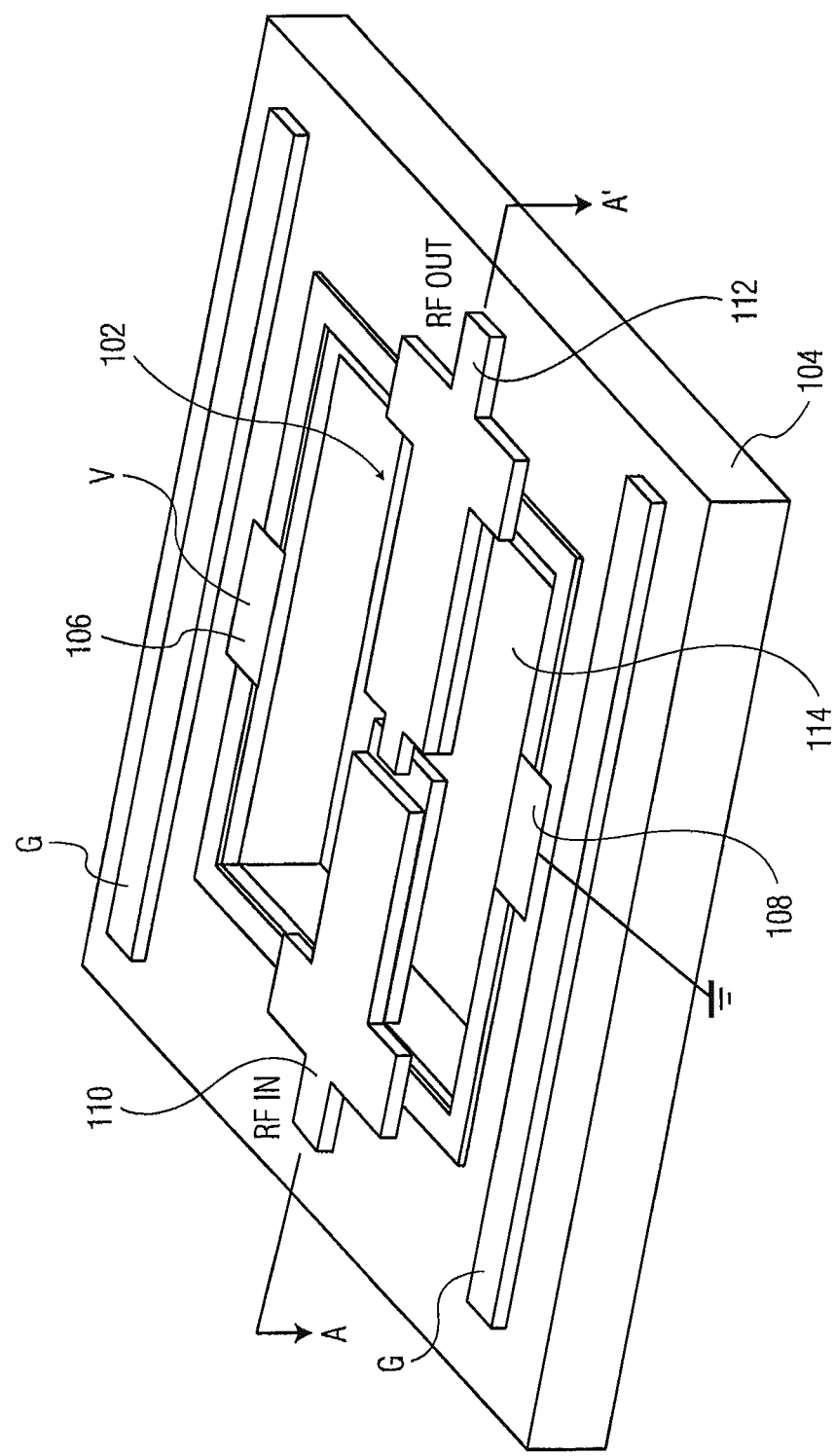
FIG. 1A is a perspective diagram of an exemplary piezoelectric switch, according to an embodiment of the present invention.
Figure 1B:
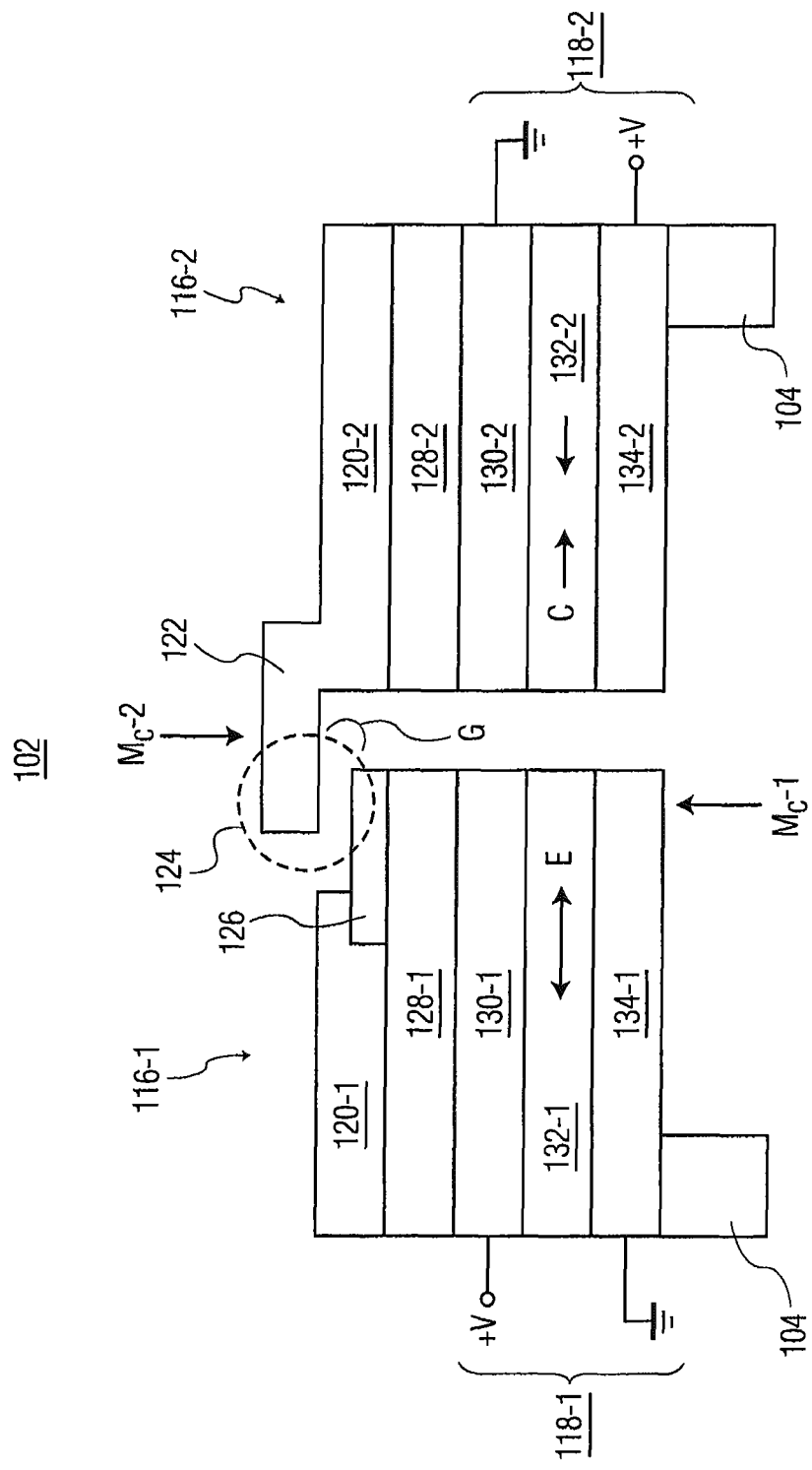
FIG. 1B is a cross-section diagram of the piezoelectric switch shown in FIG. 1A along lines A, A', illustrating closure of the piezoelectric switch.
Figure 1C:
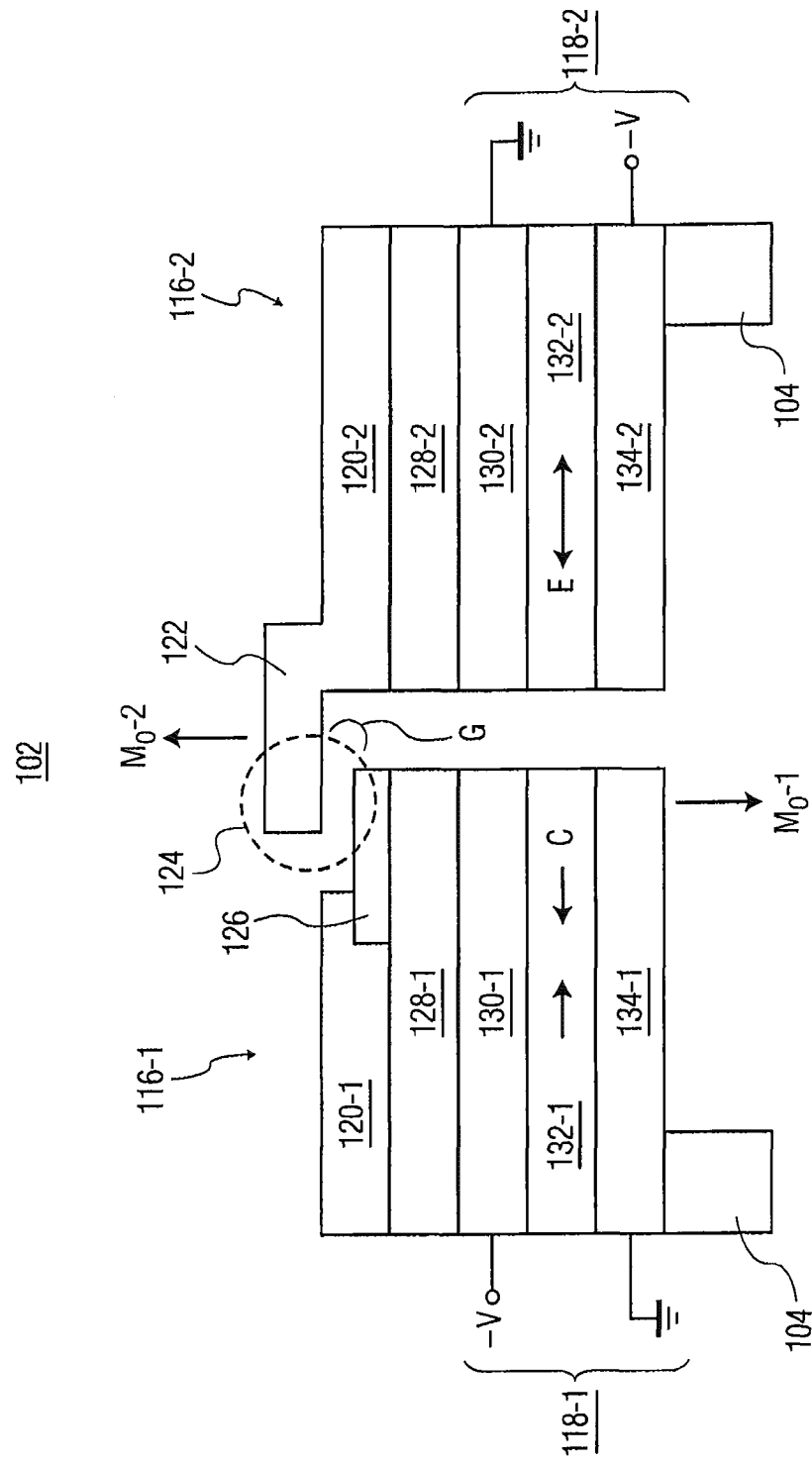
FIG. 1C is a cross-section diagram of the piezoelectric switch shown in FIG. 1A along lines A, A', illustrating opening of the piezoelectric switch.

Referring to FIGS. 1A, 1B and 1C, exemplary piezoelectric switch 102 is shown coupled to substrate 104. In particular, FIG. 1A is a perspective diagram of piezoelectric switch 102 coupled to substrate 104; FIG. 1B is a cross-section of piezoelectric device 102 and substrate 104, along lines A, A', illustrating closure of piezoelectric switch 102; and FIG. 1C is a cross-section diagram of piezoelectric device 102 and substrate 104 along lines A, A', illustrating opening of piezoelectric switch 102.

Piezoelectric switch 102 includes respective first and second cantilever beam actuators 116-1, 116-2 (i.e. representing dual-beam actuators). Each cantilever beam actuator 116 includes conductor layer 120 disposed above piezoelectric actuation layer 118. In addition, each cantilever beam actuator 116 includes isolation layer 128 between conductor layer 120 and piezoelectric actuation layer 118. Isolation layer 128 may be used to isolate an actuation signal V (provided to piezoelectric actuation layer 118) from an RF signal (passed through conductor layer 120).

Each cantilever beam actuator 116 is coupled to substrate 104 and suspended from substrate 104 by etched portion 114. As shown in FIG. 1A, control voltage contact 106 and ground contact 108 are coupled to piezoelectric actuation layer 118. Although one control voltage contact 106 is shown in FIG. 1A, it is understood that different control voltage contacts 106 may be coupled to piezoelectric actuation layers 118-1, 118-2. Accordingly, a common actuation signal (i.e. with one control voltage contact 106) may control actuation of both cantilever beam actuators 116-1, 116-2. Alternatively, different actuation signals may be used to separately control actuation of cantilever beam actuators 116-1, 116-2.

RF input signal contact 110 is coupled to contact layer 120-1 of first cantilever beam actuator 116-1. RF output signal contact 112 is coupled to conductor layer 120-2 of second cantilever beam actuator 116-2. Although FIG. 1A illustrates RF input signal contact 110 coupled to conductor layer 120-1 and RF output signal contact 112 connected to conductor layer 120-2, it is understood that RF input signal contact 110 may be coupled to conductor layer 120-2 and RF output signal contact 112 may be coupled to conductor 120-1.

As shown in FIG. 1B, conductor layer 120-2 of second cantilever beam actuator 116-2 includes projection 122 that overlap first cantilever beam actuator 116-1 in contact region 124. First cantilever beam actuator 116-1 is separated from second cantilever beam actuator 116-2 by nanogap (G). In an exemplary embodiment, nanogap G is about 200 nm to about 300 nm. The nanogap can also be made smaller or larger and ranges between about 100 to about 3,000 nm. Nanogap G provides electrical isolation between first and second cantilever beam actuators 116-1, 116-2. In addition to conductor layer 120-1, first cantilever beam actuator 116-1 includes further conductor layer 126 in the vicinity of the contact region 124. Accordingly, when piezoelectric switch 102 is closed, projection 122 is in contact with further conductor layer 126 (where further conductor layer 126 is also in contact with conductor layer 120-1).

Each piezoelectric actuation layer 118 includes piezoelectric film 132, as well as respective first and second electrodes 130, 134 disposed on opposite of surfaces of piezoelectric film 132. In an exemplary embodiment, each piezoelectric actuation layer 118 may be formed from a unimorph actuator. In another embodiment, each piezoelectric actuation layer 118 may be formed from a bimorph actuator.

In an exemplary embodiment, isolation layer 128 and piezoelectric film 132 are formed from a same piezoelectric material. Any suitable piezoelectric material may be used for isolation layer 128 and piezoelectric film 132, for example, aluminum nitride, zinc oxide, lead zirconate titanate (PZT), gallium arsenide, aluminum gallium arsenide or any combination thereof.

In an exemplary embodiment, first and second electrodes 130, 134 and further conductor layer 126 are each formed from platinum. It is understood that any metallic material may be used for first and second electrodes 130, 134 and further conductor layer 126, provided that the metallic material satisfies any desired material compatibility with piezoelectric film 132 or isolation layer 128 (e.g., adhesion, formation of deleterious phases with piezoelectric film 132/isolation layer 128, or a quality of piezoelectric film 132/isolation layer 128 that may be deposited thereto). Examples of materials for electrodes 130, 134, and further conductor layer 126 include, but are not limited to, gold, platinum, iridium, ruthenium, molybdenum, titanium, rhodium, tungsten, copper or any suitable type of alloy formed by a combination thereof.

Although in an exemplary embodiment, conductor layer 120 is formed from gold, it is understood that conductor layer 120 maybe formed from any suitable conductive metallic material such as copper, chromium or aluminum. In general, metallic materials that are highly conductive are desired.

Although FIG. 1A illustrates first cantilever beam actuator 116-1 collinear with second cantilever beam actuator 116-2, it is contemplated that second cantilever beam actuator 116-2 may be positioned at an angle with respect to first cantilever actuator beam 116-1. Furthermore, although one conductor layer 120 and one piezoelectric actuation layer 118 is illustrated for each cantilever beam actuator 116, it is understood that conductor layer 120 may include multiple conductor layers and that piezoelectric actuation layer 118 may include multiple piezoelectric actuation layers. Furthermore, it is understood that more than one projection 122 and more than nanogap G may be provided on conductor layer 120-2.

Referring to FIG. 1B closure of piezoelectric switch 102 is explained. To close piezoelectric switch 102, a positive voltage (+V) is applied to first electrode 130-1 of first cantilever beam actuator 116-1 on and positive voltage +V is simultaneously applied to second electrode 134-2 and of second cantilever beam actuator 116-2. In addition, second electrode 134-1 and first electrode 130-2 are coupled to ground.

Application of the positive voltage to first cantilever beam actuator 116-1 causes piezoelectric film 132-1 to expand (illustrated by double headed arrow E). Expansion of piezoelectric film 132-1 causes cantilever beam actuator 116-1 to bend upward, as shown by arrow $M_C$-1. Application of the positive voltage to second cantilever beam actuator 116-2 causes piezoelectric film 132-2 to contract (illustrated by double arrows C). Contraction of piezoelectric film 132-2 causes second cantilever beam actuator 116-2 to bend in a downward direction, as shown by arrow $M_C$-2. Accordingly, because first cantilever actuator beam 116-1 bends upward ($M_c$-1) and second cantilever beam actuator 116-2 bends downward ($M_c$-2), projection 122 contacts further conductor layer 126 and piezoelectric switch 102 is closed. Accordingly, when piezoelectric switch 102 is closed, an RF signal may be passed from input signal contact 110 to output signal contact 112 (FIG. 1A).

Referring to FIG. 1C, opening of piezoelectric switch 102 is explained. To close piezoelectric switch 102, a negative voltage (−V) is applied to first electrode 130-1 of first cantilever beam actuator 116-1 on and negative voltage −V is simultaneously applied to second electrode 134-2 and of second cantilever beam actuator 116-2. In addition, second electrode 134-1 and first electrode 130-2 are coupled to ground.

Application of the negative voltage to first cantilever beam actuator 116-1 causes piezoelectric film 132-1 to contract (illustrated by double arrows C). Contraction of piezoelectric film 132-1 causes cantilever beam actuator 116-1 to bend downward, as shown by arrow $M_O$-1. Application of the negative voltage to second cantilever beam actuator 116-2 causes piezoelectric film 132-2 to expand (illustrated by double headed arrow E). Expansion of piezoelectric film 132-2 causes second cantilever beam actuator 116-2 to bend in an upward direction, as shown by arrow $M_O$-2. Accordingly, because first cantilever actuator beam 116-1 bends downward ($M_O$-1) and second cantilever beam actuator 116-2 bends upward ($M_O$-2), projection 122 is electrically isolated from further conductor layer 126 and piezoelectric switch 102 is opened. Accordingly, when piezoelectric switch 102 is opened, an RF signal may be blocked between input signal contact 110 and output signal contact 112 (FIG. 1A).

Figure 2A:
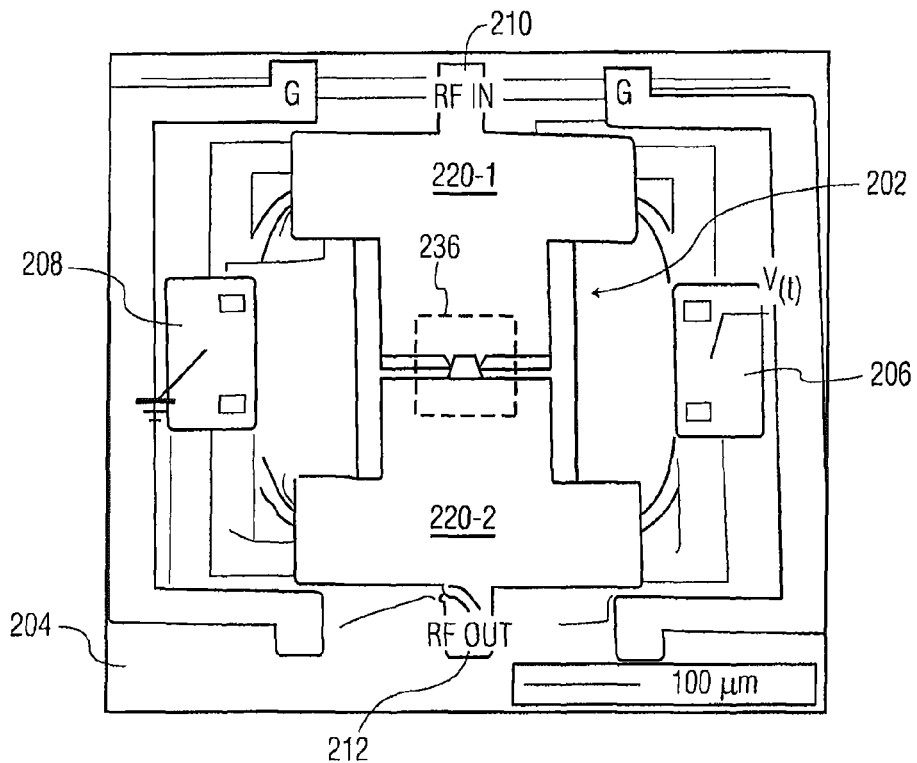
FIG. 2A is an overhead diagram of an exemplary piezoelectric switch, according to another embodiment of the present invention.
Figure 2B:
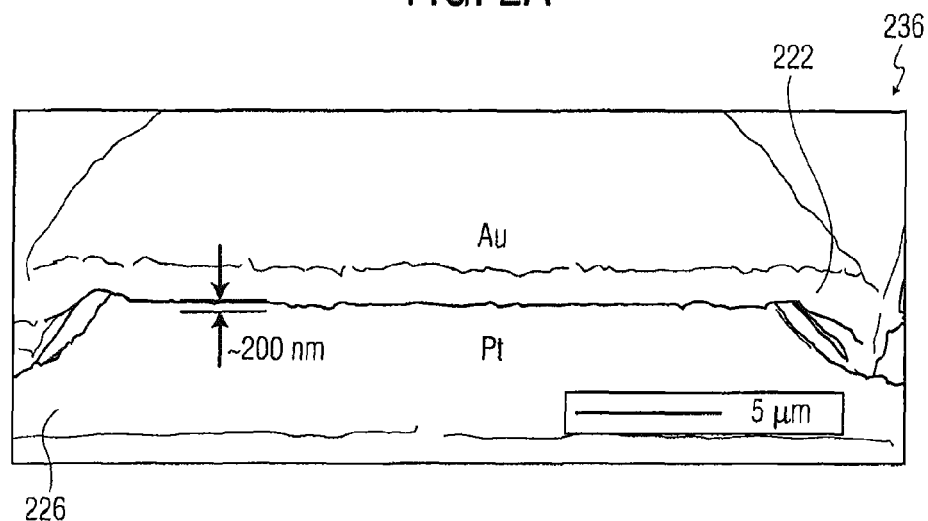
FIG. 2B is a cross-section diagram of a portion of the piezoelectric switch shown in FIG. 2A.

Referring to FIGS. 2A and 2B, piezoelectric switch 202 coupled to substrate 204 is shown. In particular, FIG. 2A is an overhead view diagram of piezoelectric device 202 and substrate 204; and FIG. 1B is a cross-section of a portion of piezoelectric switch 202 in region 236.

Control voltage contact 206 and ground contact 208 are coupled to piezoelectric switch 202 via a piezoelectric actuation layer (not shown), similar to piezoelectric switch 102 (FIG. 1A). Input signal contact 210 and output signal 212 are coupled to respective conductor layers 220-1, 220-2 of piezoelectric 202. As shown in FIG. 2B, piezoelectric switch 202 includes a gold projection 222 and a platinum further conductor layer 226 that are separated by a nanogap of about 200-300 nm when piezoelectric switch 202 is not actuated or open.

Figure 3A:
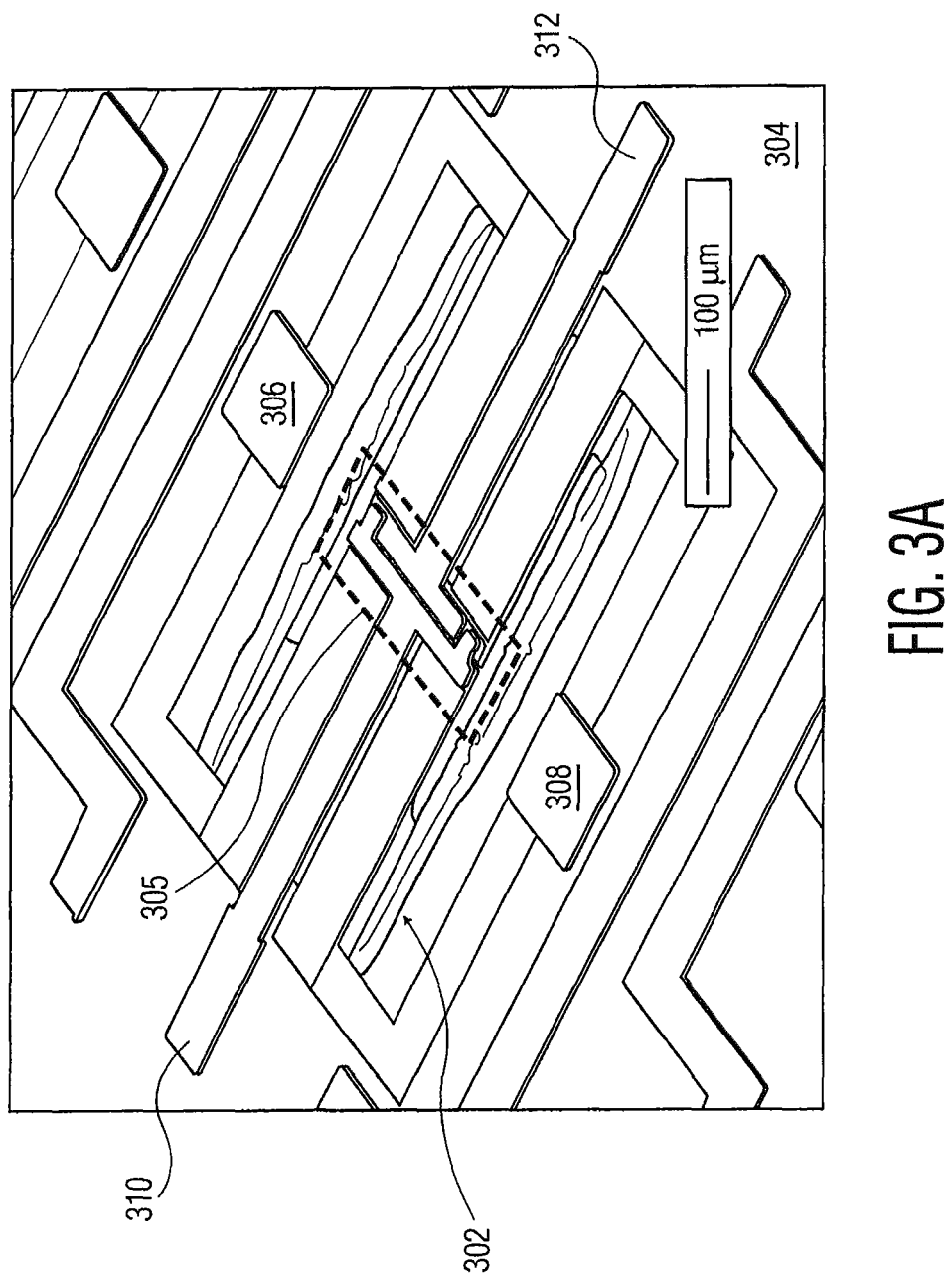
FIG. 3A is a perspective diagram of an exemplary piezoelectric switch, according to a further embodiment of the present invention.
Figure 3B:
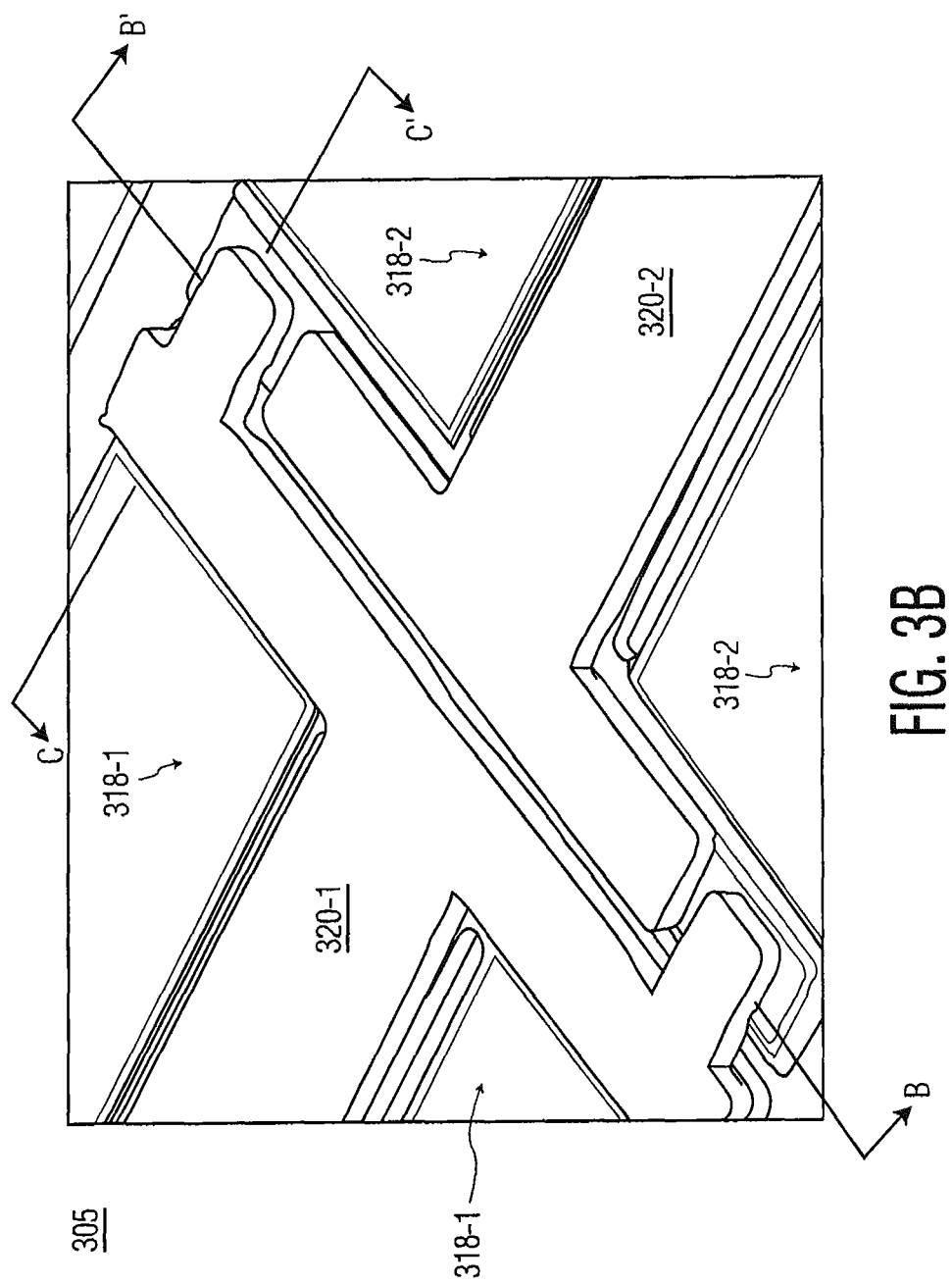
FIG. 3B is a perspective diagram of a portion of the piezoelectric switch shown in FIG. 3A.
Figure 3D:
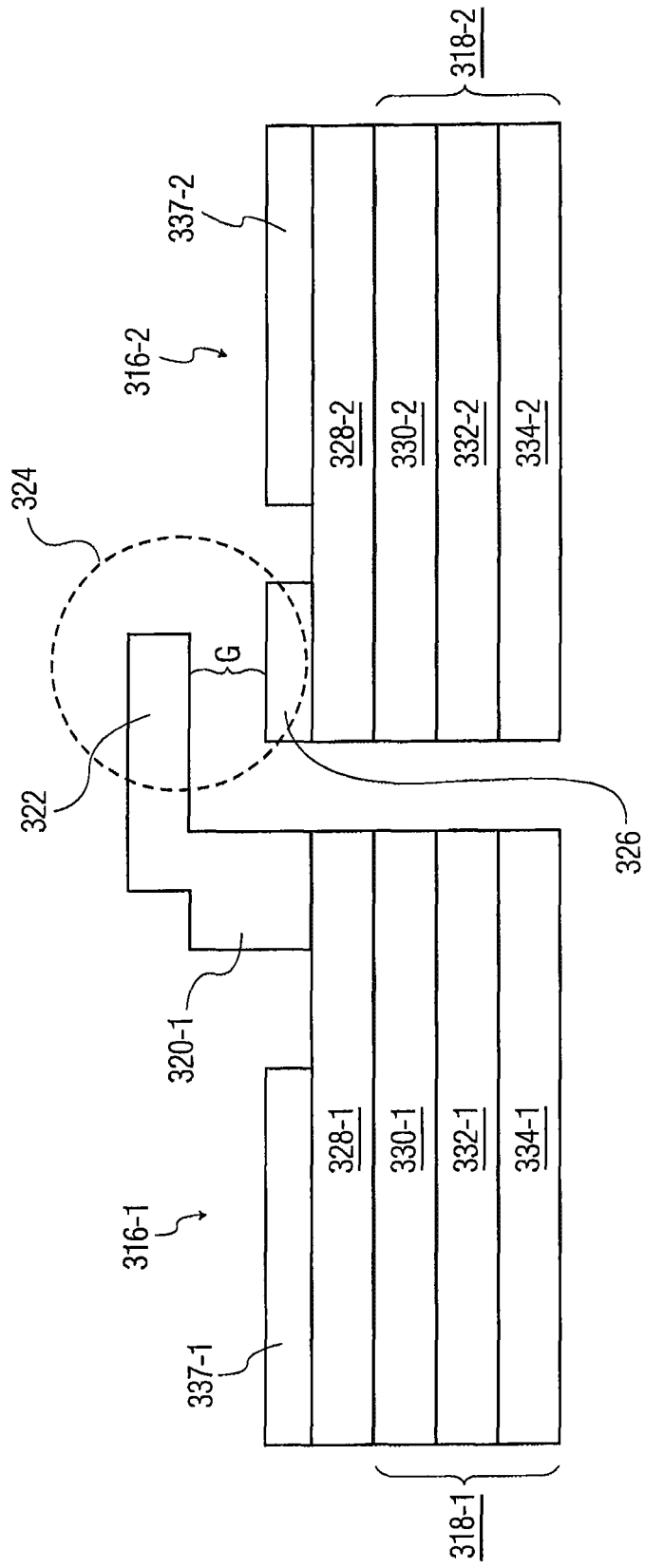
FIG. 3D is a cross-section diagram of the portion of the piezoelectric switch shown FIG. 3B, along lines C, C'.

Referring to FIGS. 3A, 3B, 3C and 3D, exemplary piezoelectric switch 302 is shown coupled to substrate 304. In particular, FIG. 3A is a perspective diagram of piezoelectric switch 302; FIG. 3B is a perspective diagram of a portion of piezoelectric switch 302 in region 305; FIG. 3C is a cross-section diagram of the portion of piezoelectric switch 302, along lines B, B'; and FIG. 3D is a cross-section diagram of the portion of piezoelectric switch 302, along lines C, C'.

Piezoelectric switch 302 is the same as piezoelectric switch 102 (FIG. 1A) except that piezoelectric actuation layer 318 is disposed next to conductor layer 320 (rather than being disposed only below conductor layer 120 (FIG. 1B)). In addition, each cantilever beam actuator 316 includes dual piezoelectric actuation layers 318 with conductor layer 320 positioned therebetween. Accordingly, conductor layer 320 (which carries an RF signal) is further separated from first and second electrodes 330, 334 (which provide an actuation signal to piezoelectric film 332). Piezoelectric switch 302, thus, may reduce a coupling between the RF and actuation signals.

As shown in FIGS. 3A and 3B, input signal contact 310 is coupled to conductor layer 320-1 and output signal contact 312 is coupled to conductor layer 320-2. Control voltage contact 306 is coupled to dual actuation layers 318-1, 318-2 and ground contact 308 is coupled to dual piezoelectric actuation layer 318-1, 318-2. Although one control voltage contact 306 is illustrated, it is understood that different control voltage contacts 306 may be provided to separately control each cantilever beam actuator 316-1, 316-2.

As shown in FIG. 3C, along lines B, B', conductor layer 320-2 of the second cantilever beam actuator 316-2 is disposed above isolation layer 328-2. In addition, further conductor layer 326 is disposed between conductor layer 320-2 and isolation layer 328-2. Conductor layer 320-1 of the first cantilever beam actuator 316 is separated from further conductor layer 326 by nanogap G. In addition, piezoelectric actuation layer 318-2 is disposed below isolation layer 328-2.

Referring to FIG. 3D, along lines C, C', each cantilever beam actuator 316 includes piezoelectric actuation layer 318 disposed below isolation layer 328. Each piezoelectric actuation layer 318 includes piezoelectric layer 332 and first and second electrodes 330, 334. Each cantilever beam also includes top electrode 337 disposed on isolation layer 328 and separated from conductor layer 320. First cantilever beam actuator 316-1 also includes conductor layer 320-1 having projection 322 that overlaps second cantilever beam actuator 316-2 in contact region 324. Second cantilever beam actuator 316-2 includes further conductor layer 326 that is separated from projection 322 by nanogap G. Top electrode 337 may be coupled to ground contact 308, for example, to electrically isolate conductor layer 320 from piezoelectric actuation layer 318.

Similar to piezoelectric switch 102 (FIG. 1A), application of a voltage to first and second electrodes 330, 334 closes piezoelectric switch 302 such that projection 322 is in electrical contact with further conductor layer 326. Because further conductor layer 326 is in contact with conductor layer 320-2, and RF signal from input signal contact 310 is passed along conductor layers 320-1, 320-2 and provided to output signal contact 312. Similarly, by providing a voltage with a reverse polarity to electrodes 330, 334, projection 322 may be electrically isolated from further conductor layer 326, thus opening piezoelectric switch 302.

Figure 4A:
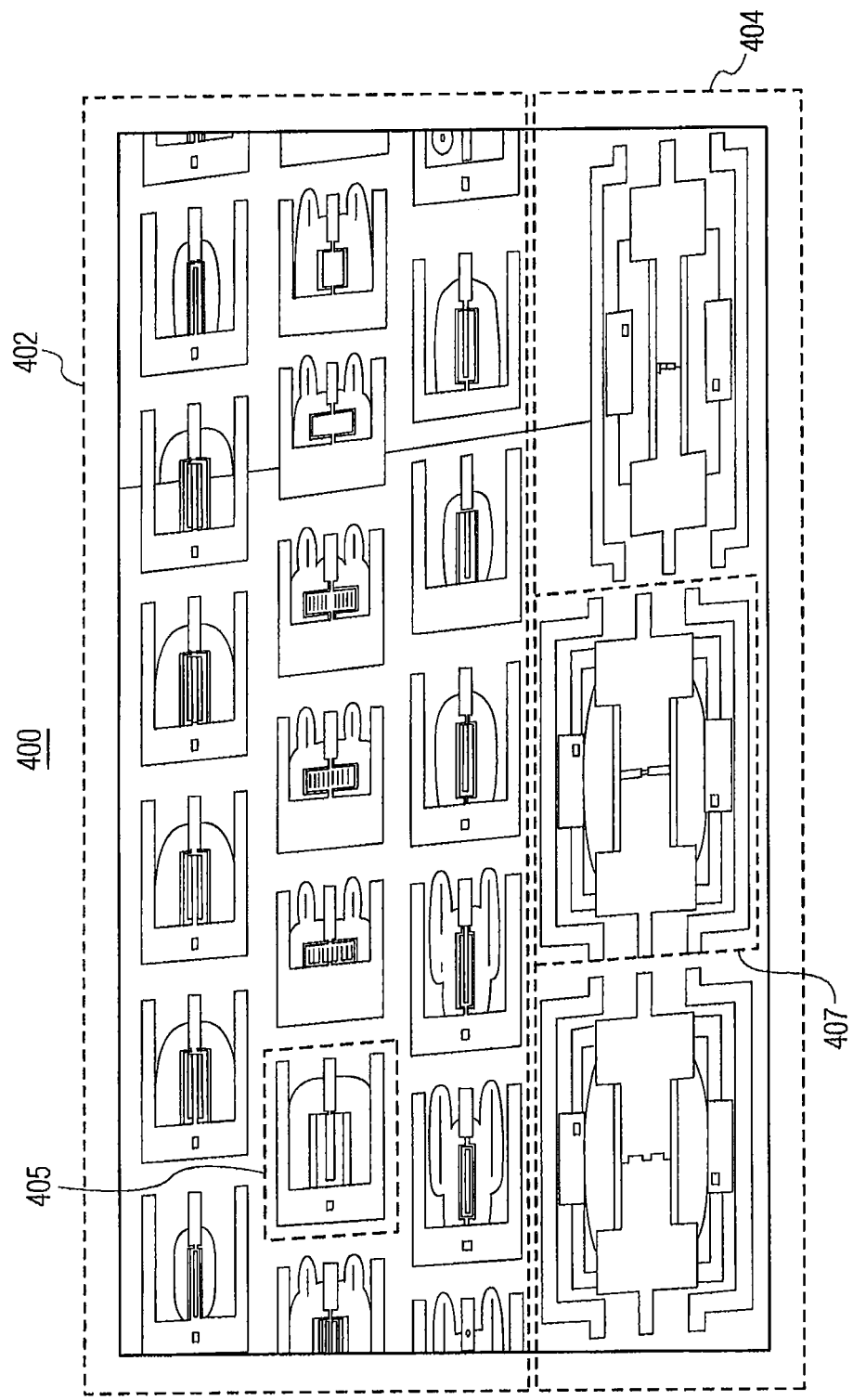
FIG. 4A is an overhead diagram of an exemplary semiconductor chip including contour-mode (CM) piezoelectric transducers and piezoelectric switches, according to an embodiment of present invention.
Figure 4B:
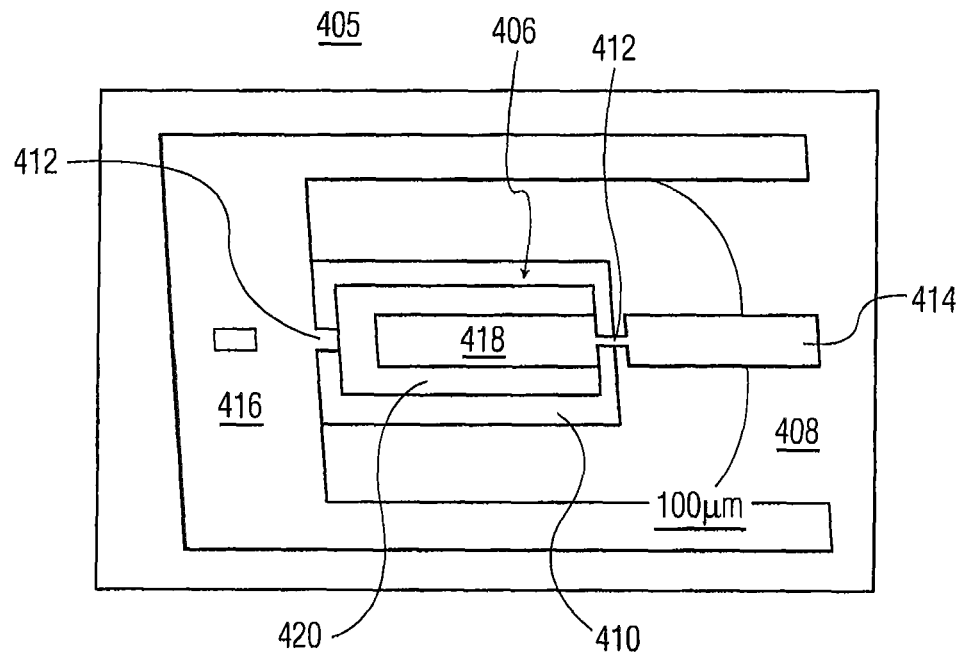
FIG. 4B is a perspective diagram of a CM piezoelectric transducer included in the semiconductor chip shown in FIG. 4A.
Figure 4C:
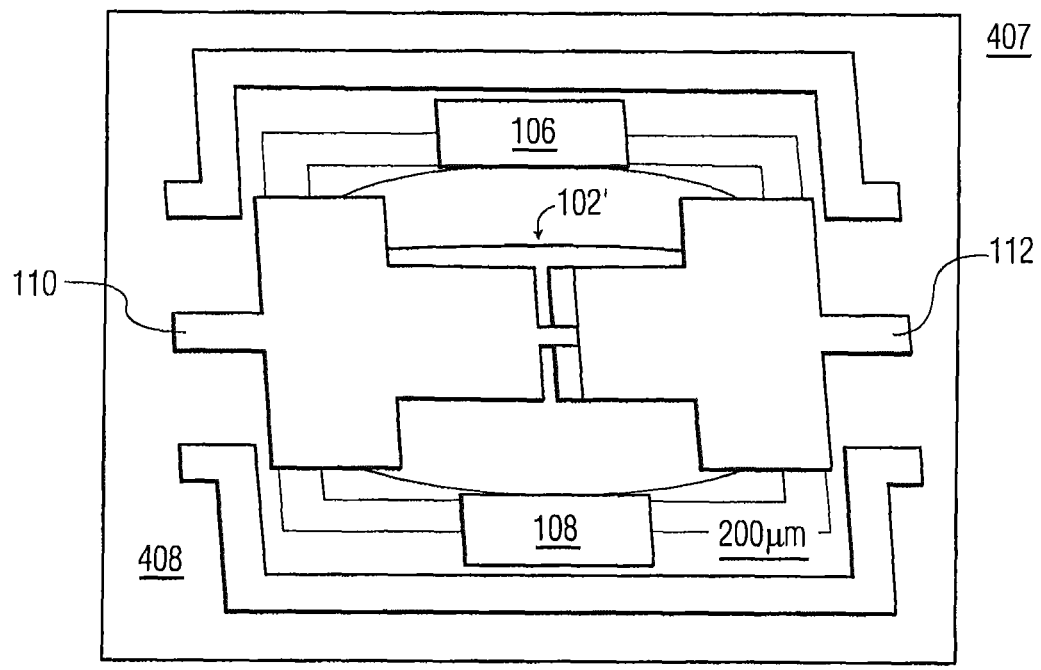
FIG. 4C is a perspective diagram of a piezoelectric switch included in the semiconductor chip shown in FIG. 4A.

Referring next to FIGS. 4A, 4B and 4C, semiconductor chip 400 including transducer region 402 and switch region 404 is shown. Transducer region 402 includes a plurality of CM piezoelectric transducers and switch region 404 includes a plurality of piezoelectric switches. In particular, FIG. 4A is an overhead diagram of semiconductor chip 400; FIG. 4B is a perspective diagram of portion 405 of semiconductor chip 400 illustrating CM piezoelectric transducer 406; and FIG. 4C is a perspective diagram of portion 407 of semiconductor chip 400 illustrating piezoelectric switch 102'.

Referring to FIG. 4B, portion 405 of transducer region 402 illustrates CM piezoelectric transducer 406 suspended from substrate 408. CM piezoelectric transducer 406 include piezoelectric film 420 and top and bottom electrodes 418 (only top electrode 418 is shown). Piezoelectric film 420 is suspended so that it is spaced away from substrate 408. Piezoelectric transducer 406 is tethered to substrate 408 by one or more tethers 412 and is separated from substrate 408 by etched portion 410. Input/output (I/O) contact 414 is coupled to top electrode 418 and ground contact 416 is coupled to bottom electrode 418. Because piezoelectric transducer 406 is suspended from substrate 408, all electrical connections may be provided via tethers 412. A number of tethers 412, thus, may be selected according to a suitable number and/or arrangement of electrical connections to piezoelectric transducer 406.

Although FIG. 4B illustrates that piezoelectric film 420 is rectangular-shaped, it is contemplated that piezoelectric film 420 may be configured into any suitable shape, in order to control a bandwidth and center frequency of CM piezoelectric transducer 406. Examples of piezoelectric film shape include, but are not limited to, a rectangle, a ring, a circle, or any other polygon shape. As described further below with respect to FIGS. 5A-5H, electrodes 418 may be formed from a same material as the electrodes of piezoelectric switch 102'. In addition, in an exemplary embodiment, piezoelectric film 420 of CM piezoelectric transducer 406 is desirably formed from a same material as the piezoelectric film of piezoelectric switch 102.

Referring to FIG. 4C, portion 407 of switch region 404 illustrates piezoelectric switch 102' coupled to substrate 408. Piezoelectric switch 102' is the same as piezoelectric switch 102 (FIG. 1A), except that piezoelectric switch 102' is coupled with CM piezoelectric transducer 406 to substrate 408. Although piezoelectric switch 102' is illustrated in FIG. 4C, it is understood that switch region 404 may include any suitable dual-beam piezoelectric switch, including piezoelectric switch 202 (FIG. 2A) or piezoelectric switch 302 (FIG. 3A). Although not illustrated in FIGS. 4A, 4B and 4C, it is contemplated that piezoelectric switches in switch region 404 and CM piezoelectric transducers in transducer region 402 may be electrically connected on the same substrate 408.

Figure 5A:
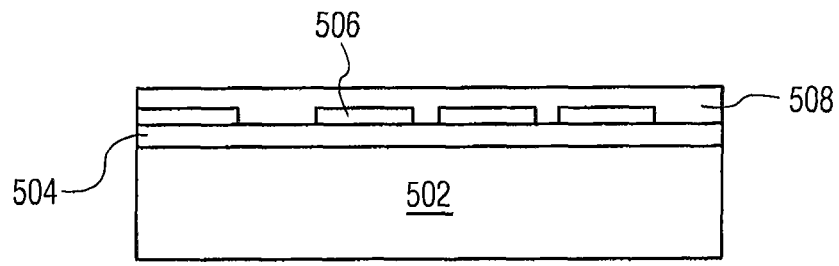
FIGS. 5A, 5B, 5C, 5D, 5E, 5F, 5G and 5H are cross-section diagrams illustrating an exemplary method for forming a semiconductor chip including a piezoelectric switch and a CM piezoelectric transducer, according to an embodiment of the present invention.

Referring to FIGS. 5A-5H, a fabrication process for fabricating an exemplary semiconductor chip 524 is shown. In FIG. 5A, low-stress nitride (LSN) 504 may be deposited on silicon substrate 502 to provide electrical isolation. Bottom metal electrodes 506 are sputter-deposited in a suitable pattern by lift-off. Piezoelectric layer 508 is sputter-deposited on LSN layer 504. Bottom electrodes 506, for example, represent bottom electrodes of piezoelectric transducer 522 and second electrodes of piezoelectric switch 520. In an exemplary embodiment, a 1 μm thick piezoelectric film 508 is deposited on a 300 nm thick layer of LSN 504 and a 200 nm thick layer of electrode 506.

Figure 5B:
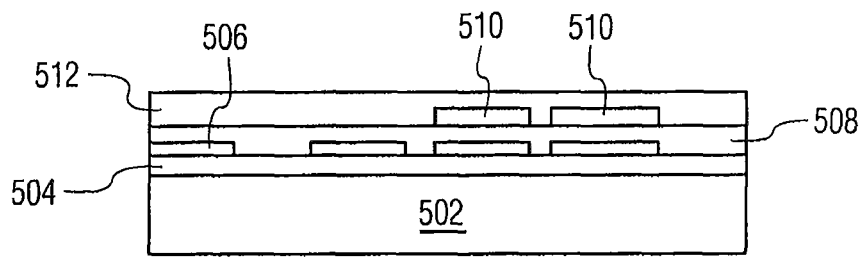

In FIG. 5B, middle electrodes 510 are sputter-deposited on piezoelectric layer 508 in a suitable pattern by lift-off. Middle electrodes 510 are used in a region corresponding to piezoelectric switch 520 and represent first electrodes of piezoelectric switch 520. Isolation layer 512 is sputter-deposited on piezoelectric layer 508. In an exemplary embodiment, a 200 nm thick layer of middle electrode 510 and a 1 μm thick isolation layer 512 is deposited on piezoelectric layer 508. As described above, it is desirable that isolation layer 512 and piezoelectric layer 508 is formed from a same material. Isolation layer 512 represents an isolation layer of piezoelectric switch 520. The combination of isolation layer 512 and piezoelectric layer 508 represent a piezoelectric film for piezoelectric transducer 522.

Figure 5C:
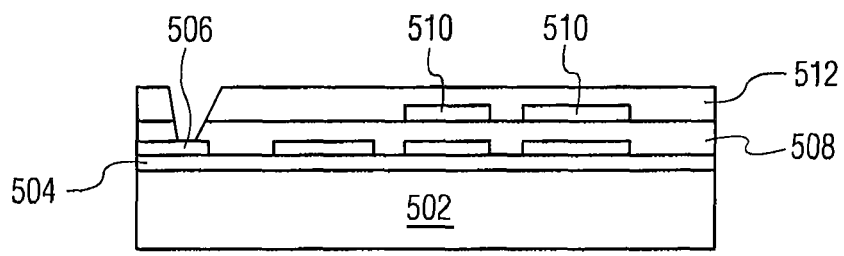
Figure 5D:
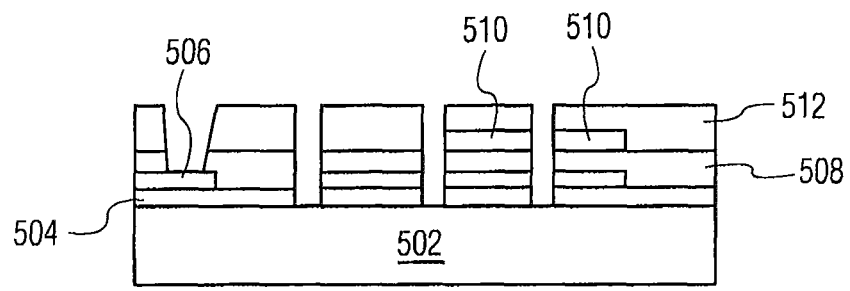

In FIG. 5C, contacts are opened through isolation layer 512 and piezoelectric layer 508 to bottom metal electrodes 506, by a wet etching in a hot (e.g., 70° C.) AZ400k bath. In FIG. 5D, isolation layer 512 and piezoelectric layer 508 are masked using silicon oxide and etched by a chlorine-based dry etching process.

Figure 5E:
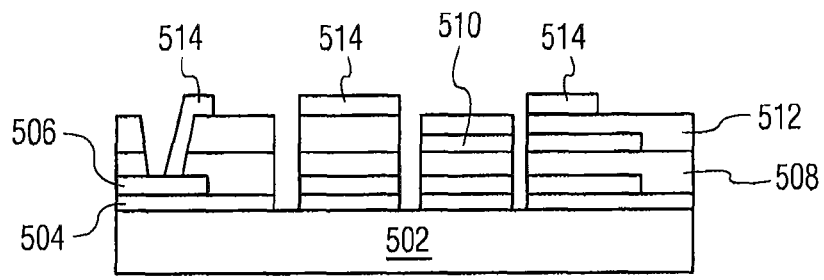

In FIG. 5E, top electrodes 514 are sputter-deposited and patterned by lift-off. For example, top electrodes 514 are used to form a further conductor layer of piezoelectric switch 520 and a top electrode of piezoelectric transducer 522. In an exemplary embodiment, a 200 nm thick layer of top electrode 514 is deposited on isolation layer 512.

Figure 5F:
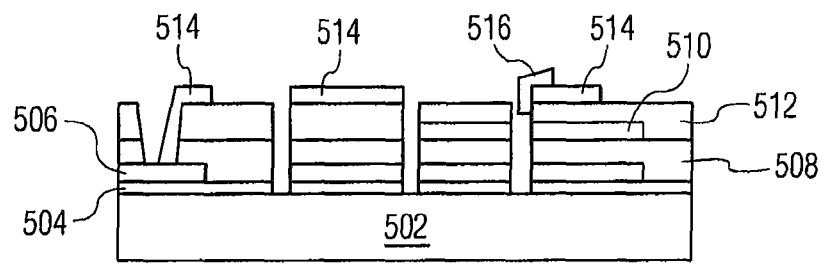
Figure 5G:
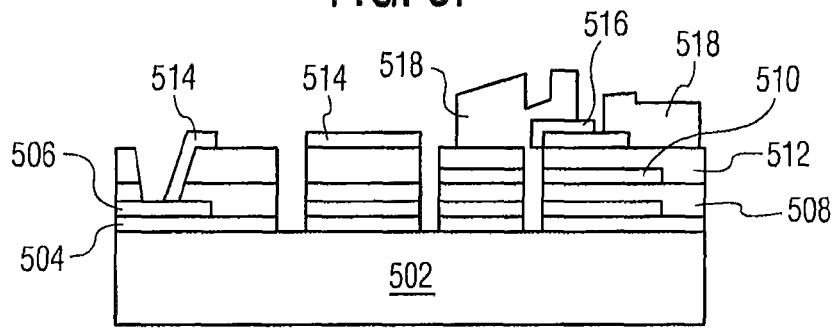

In FIG. 5F, amorphous silicon sacrificial layer 516 is sputter-deposited or evaporated and patterned by lift-off. In FIG. 5G, conductor seed layer 518 is deposited and a photoresist is used to pattern the conductor layer. In an exemplary embodiment, a gold seed layer was used.

Figure 5H:
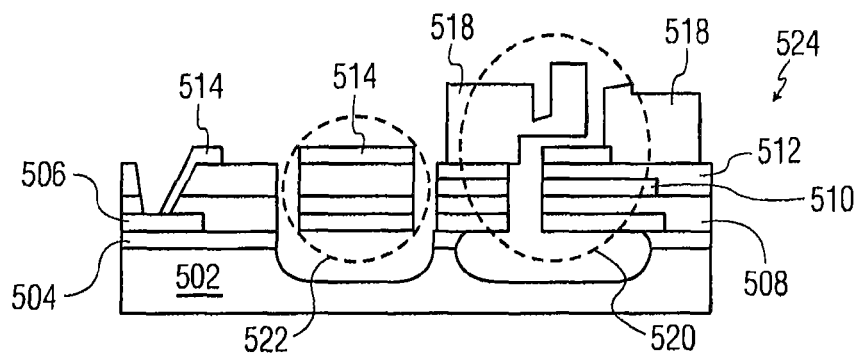

In FIG. 5H, conductor seed layer 518 is wet-etched. In addition, sacrificial layer 516, piezoelectric switch 520 and piezoelectric transducer 522 are released by dry etching from substrate 502 in xenon difluoride ($XeF_2$). Alternatively, the structures may be released by a wet etching process.

Although an LSN layer 504 is illustrated, it is contemplated that layer 504 may be formed from a material including silicon nitride, silicon dioxide, aluminum nitride, silicon carbide, titanium dioxide, polylmide dielectrics, hafnium dioxide, SU-8 photoresist polymer dielectrics, and combinations thereof.

The fabrication process shown in FIGS. 5A-5H is post-CMOS compatible, enabling complete integration of piezoelectric switches 520 and piezoelectric transducers 522 on a same semiconductor chip. Conductor layer 518 serves at least two purposes. One purpose includes functioning as a low resistance carrier for an RF signal. A second purpose includes functioning as a structural layer to offset a neutral axis of a cantilever beam actuator used to produce a bending moment for switch actuation.

Typically, the material or actuation scheme of conventional MEM switches are not compatible with piezoelectric CM piezoelectric transducers. For example, CM piezoelectric transducers typically use aluminum nitride for the piezoelectric film. Conventional MEM switches, in contrast, typically use electrostatic actuation or a material such as PZT that is not compatible with the aluminum nitride piezoelectric film of the CM piezoelectric transducers. In addition, there are design tradeoffs between MEM switches and CM piezoelectric transducers. MEM switches are typically designed to produce a large displacement whereas CM piezoelectric transducers typically are designed to have a high center frequency and a high quality factor.

By developing a piezoelectric switch using a same material as a CM piezoelectric transducer, an integrated RF platform may be produced that includes both piezoelectric switches 520 and contour-mode transducers 522. The fabrication process of the present invention allows for co-fabrication of piezoelectric switches 520 and contour-mode piezoelectric transducers 522 on a same chip while optimizing the performance of each component. By monolithically integrating piezoelectric switches 520 with CM piezoelectric transducers 522 on a single semiconductor chip, a compact, low loss and integrated multi-frequency RF front-end may be produced.

Next, examples of the performance of piezoelectric switch 102 (FIG. 1A) and a CM piezoelectric transducer integrated with piezoelectric switch 102 is described.

Figure 6:
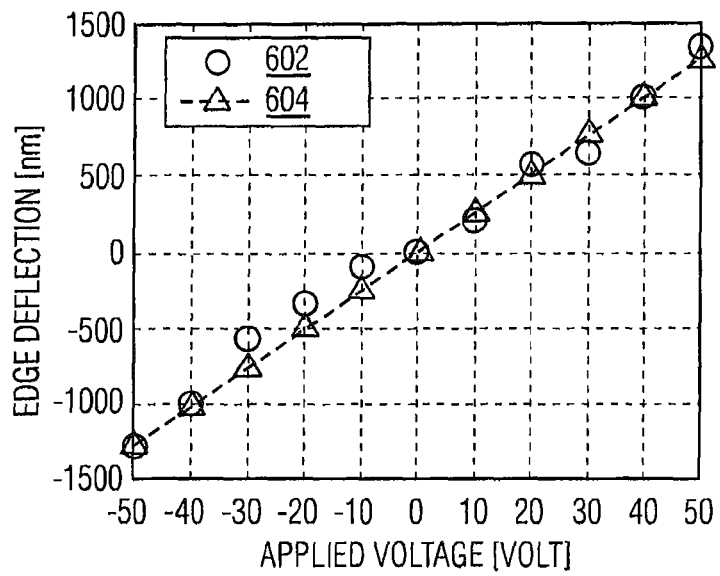
FIG. 6 is a graph of simulated and measured edge deflection as a function of applied voltage for a piezoelectric actuator similar to the switch shown in FIG. 1A.

Referring to FIG. 6, experimental edge deflection 602 and simulated edge deflection 604 are shown as a function of applied voltage for a piezoelectric actuator similar to switch 102 (FIG. 1A). The piezoelectric actuator refers to one of the cantilever beam actuators that form piezoelectric switch 102 (FIG. 1A). The results shown in FIG. 6 are for a piezoelectric actuator that includes a unimorph actuator and is about 300× 100 μm. The experimental edge deflection 602 showed good agreement with simulated edge deflection 604.

In contrast to conventional MEM switches, piezoelectric switch 102 (FIG. 1A) uses a low actuation voltage (for example, about 7 V-20 V) and has a linear switch response. Because exemplary piezoelectric switches use a low actuation voltage and have a linear response, the cantilever beam actuators of piezoelectric switch 102 may provide a force enhancement between the two cantilever beam actuators at the contact region as the actuation voltage is increased.

Figure 7A:
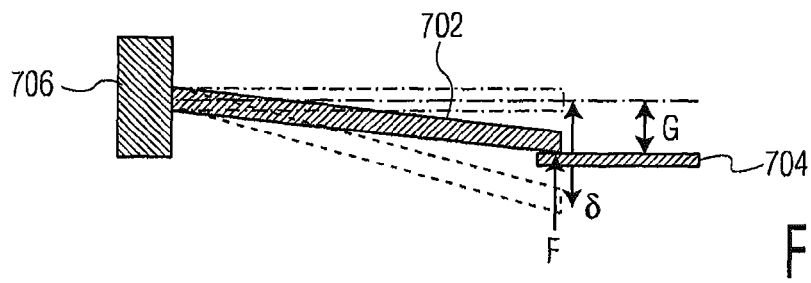
FIG. 7A is a cross-section diagram of dual cantilever beams illustrating determination of an applied force at a contact region for the cantilever beams.
Figure 7B:
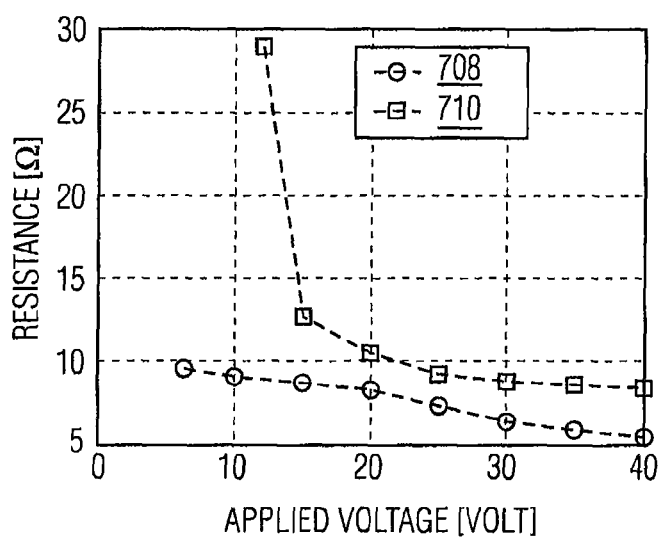
FIG. 7B is a graph of DC contact resistance as a function of applied voltage for the piezoelectric switch shown in FIG. 1A.

An explanation of the force enhancement is provided with respect to FIGS. 7A and 7B. In particular, FIG. 7A is a cross-section diagram of cantilever beams 702 and 704 (only a portion of beam 704 is shown), illustrating determination of an applied force F at a contact region between cantilever beams 702, 704; and FIG. 7B is a graph of DC contact resistance as a function of applied voltage for piezoelectric switch 102 (FIG. 1A). With respect to FIG. 7B, piezoelectric switch 102 (FIG. 1A) of about 200×200 μm is used to generate the DC contact resistance measurements.

FIG. 7A illustrates first beam 702 coupled to support 706. Beam 702 is separated from second beam 704 (the support for beam 704 is not shown) by gap G. In dual-beam piezoelectric actuation, voltage is typically equivalent to a deflection (δ) of each beam 702, 704. The deflection can be considered to be equivalent to force F when first beam 702 contacts second beam 704. In addition, the actuation of second beam 702 is a function of voltage. Thus, increasing the voltage will increase the deflection δ of first beam 702.

If a voltage is applied to beam 702 such that the deflection δ is greater than switch closing gap G, first beam 702 may exert force F on second beam 704 that is proportional to δ-g (i.e., an excess deflection or the deflection that first beam 702 cannot undergo because of the presence of second beam 704). Accordingly, first beam 702 may bend by an increased amount. As a result of the excess bending, a force equivalent to the excess deflection may be applied to second beam 704. Thus, increasing an applied voltage to first beam 702 may lead to an increased excess deflection and an increased contact force between beams 702 and 704.

Referring to FIG. 7B, experimental resistance measurements for piezoelectric switch 102 illustrates that a contact force is higher in case of dual-beam actuation as opposed to single beam actuation. In particular, dual-beam on-resistance 708 (i.e., when both beams are actuated) is less than the single beam on-resistance 710 (i.e., when a single beam is actuate). The results in FIG. 7 implies that force F is higher in case of dual-beam actuation as compared to single-beam actuation.

In FIG. 7B, dual-beam on-resistance 708 illustrates an on-resistance starting from 16.7Ω at 2 V and reaching values as low as 3Ω at 40 V (for dual-beam actuation 708). Both resistances 708, 710 decrease with increased applied voltage, illustrating that higher forces produce lower on-resistance. By using dual-beam actuation, use of two actuators doubles the applied force per unit voltage. When both beams are actuated (i.e., on-resistance 708) a voltage of 6.3 V may be applied to establish contact (as opposed to about 12 V for a single-beam on-resistance 710). In addition, the contact resistance drops to about 5.4Ω at 40 V for dual-beam on-resistance 708 (as compared to about 8.4Ω for a single-beam on-resistance 710).

Another advantage of exemplary piezoelectric switches of the present invention is the use of active pull-off to open and close the piezoelectric switch. One problem typically encountered in conventional switches is that the force used to open the switch is generally structural (for example, the conventional switch accumulates a restoring force when it is pushed into contact and where the restoring force is typically due to an intrinsic stiffness of the structure). This structural force is typically limited and sometimes may not be sufficient to return the switch to its original position once it is open.

By using active pull-off, the polarity of the voltage that is applied to the piezoelectric switch may be reversed (as shown in FIGS. 1B, 1C) and thus actively apply a force to open the piezoelectric switch. By using active pull-off, the opening time of the switch may be decreased, thus providing faster switching times (for example, reducing the switching time by about half). In addition, use of active pull-off may improve the isolation of the cantilever beam actuators (i.e., the off-state impedance of the piezoelectric switch). The active pull-off mechanism may also be used to overcome any adhesion forces acting between contact of the cantilever beams.

Figure 8A:
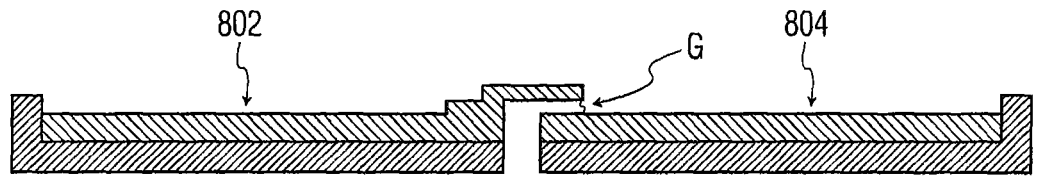
FIGS. 8A, 8B and 8C are cross-section diagrams of a dual cantilever beam switch illustrating residual stress on the unreleased and released cantilever beams and the compensation offered by the dual-beam mechanism.
Figure 8B:
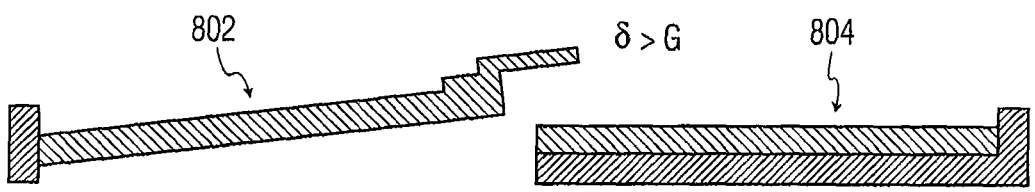

Another advantage of the present invention is that exemplary dual-beam actuated switches may be immune to residual stress and process-induced variation in a size of the initial nanogap. The immunity to residual stress is described further with respect to FIGS. 8A-8C. In particular, FIG. 8A is a cross-section diagram of unreleased first and second actuator beams 802, 804 separated by gap G; FIG. 8B is a cross-section diagram of cantilever beam 802 after release and cantilever beam 804 unreleased; and FIG. 8C is a cross-section diagram of both cantilever beams 802, 804 after release.

Residual stress is typically present in piezoelectric switch due to a difference in thermal expansion coefficients of the materials used and the deposition parameters used for the various materials. It is typically difficult to achieve a switch substantially free of residual stress. Exemplary switches of the present invention minimize the effects of residual stress by simultaneously actuating both cantilever beam actuators so that both beams 802 deflect similarly upon release. As defined herein, immunity to residual stress refers to immunity to a variability in switch closing gap G.

In order to produce switching using a low voltage, gap G is desirably designed with a predetermined height such that it may be controllably closed or opened. When one beam 802 is released (FIG. 8B), a deflection (δ) of first beam 802 may be greater than closing gap G between cantilever beams 802, 804. Because the deflection is greater than the closing gap, active pull-off actuation for one released beam 802 may cause a variability in the height of closing gap G.

Figure 8C:
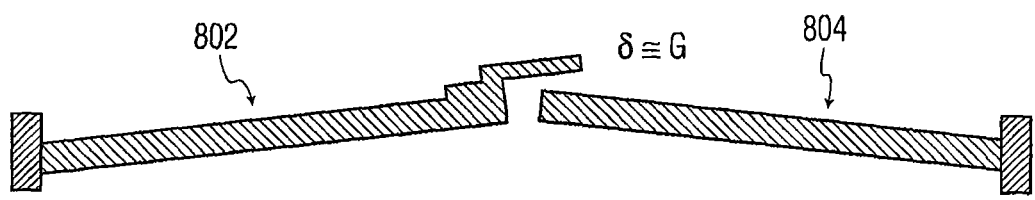

As shown in FIG. 8C, by releasing both beams 802, 804 and using substantially symmetric beams (i.e., both beams 802, 804 used for actuation are symmetric with respect to each other) the deflection δ does not affect the size of the closing gap G. Because deflection δ does not change the closing gap G, exemplary piezoelectric switches of the present invention are not substantially affected by the residual stress. In addition, because both beams 802, 804 are symmetric, each beam 802, 804 deflects similarly upon release. In this manner, gap G may be kept at approximately a same desired height.

Figure 9:
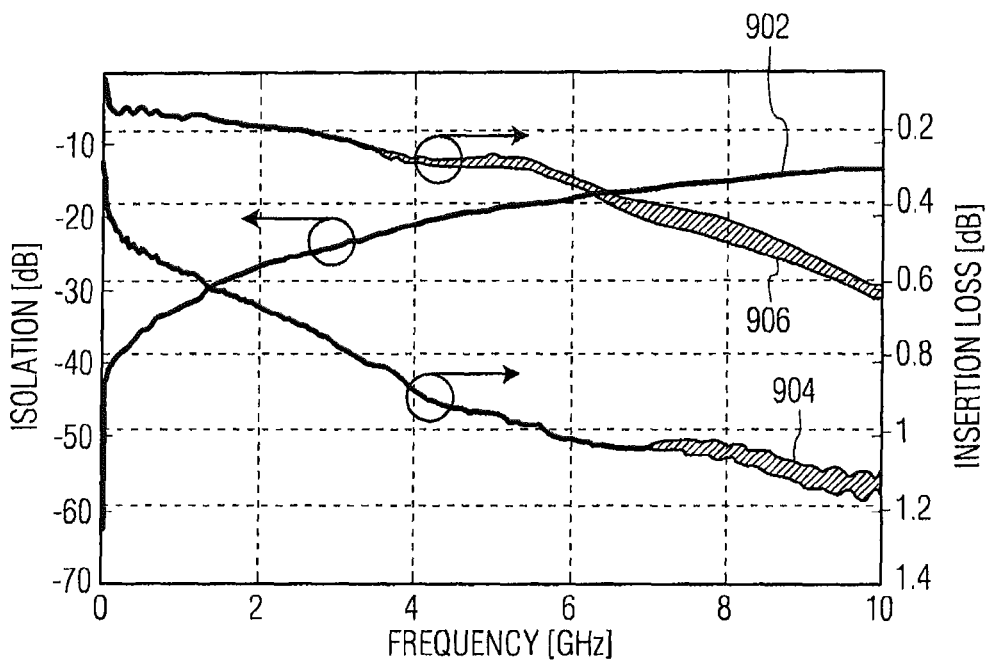
FIG. 9 is a graph of isolation and insertion loss of a function of frequency for the piezoelectric switch shown in FIG. 1A.

Referring to FIG. 9, a graph of isolation 902, insertion loss 904 and through line 906 as a function of frequency are shown for piezoelectric switch 102 (FIG. 1A). With respect to FIG. 9, a piezoelectric switch having a size of about 200×200 μm is used. Isolation 902 of greater than about 21 decibels (dB) and a low return loss of less than about 0.95 dB are obtained at about 4 GHz. An insertion loss 904 of less than about 0.9 dB and a return loss of greater than about 30 dB were obtained at about 4 GHz for the piezoelectric switch. A high insertion loss 904 at 4 GHz may be due to substrate parasitics, which may be illustrated by comparing the switch response to through-line 906. Through-line 906 represents a metal line without the presence of a piezoelectric switch. Because through-line 906 includes a large insertion loss, it is contemplated that substrate parasitics may contribute to the insertion loss 904 of the piezoelectric switch.

Figure 10:
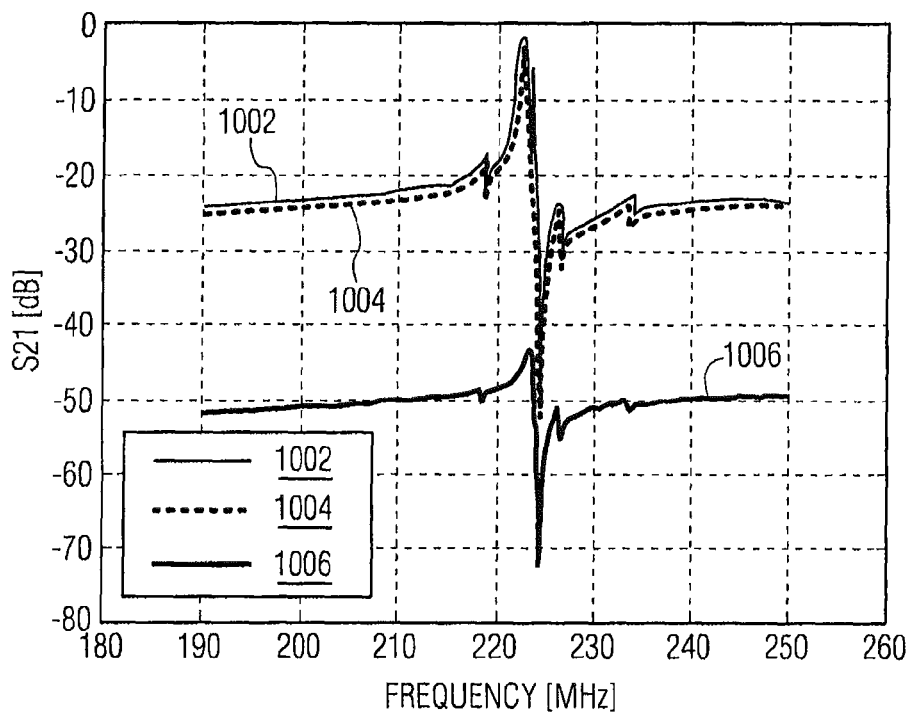
FIG. 10 is a graph of transmission as a function of frequency of a semiconductor chip including a contour-mode transducer monolithically integrated with an exemplary piezoelectric switch.

Referring to FIG. 10, a graph of transmission as a function of frequency is shown for a CM piezoelectric transducer (for example, CM piezoelectric transducer 406 (FIG. 4B)) monolithically integrated with piezoelectric switch (for example, piezoelectric switch 102' (FIG. 4C)). Response S21 1002 represents the transmission response of a CM piezoelectric transducer without integration of the piezoelectric switch. Response S21 1004 represents the combined response (i.e., cascaded S-parameters) of an integrated piezoelectric transducer and piezoelectric switch when the piezoelectric switch is turned on. Response S21 1006 represents the combined response when the piezoelectric switch is turned off. As shown in FIG. 10, response S21 1002 (without integration of piezoelectric switch) substantially overlaps the response S21 1004 (the combined response with piezoelectric switch turned on). Accordingly, the overlap between responses S21 1002 and S21 1004 illustrate that introduction of a piezoelectric switch on a same substrate as piezoelectric transducer does not substantially affect the piezoelectric transducer response.

Figure 11A:
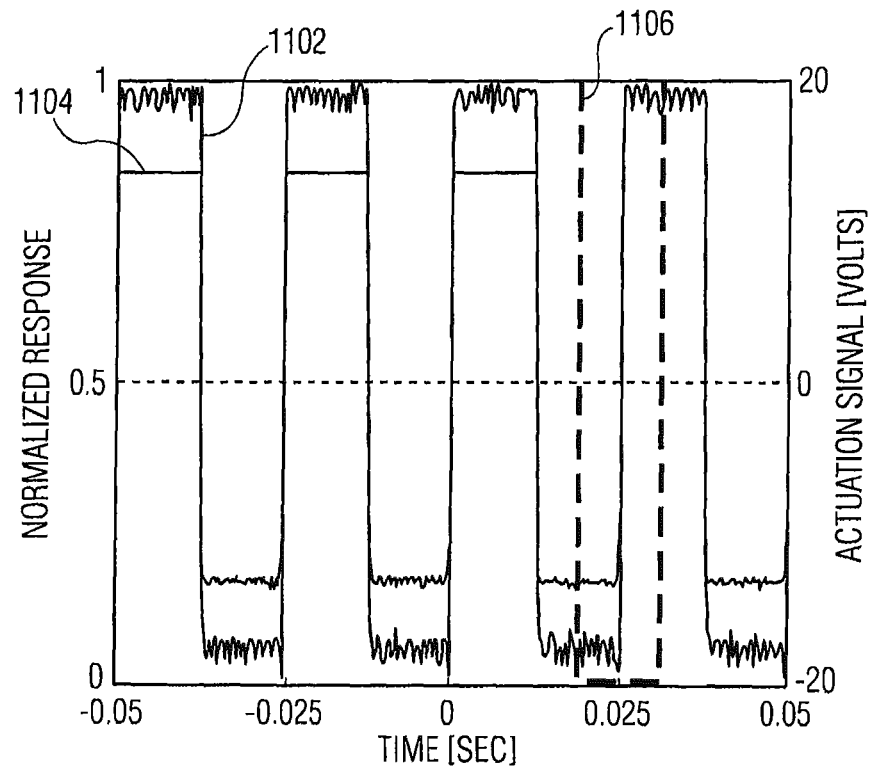
FIG. 11A is a graph of a normalized switch response to an AC test signal as a function of time for the piezoelectric switch shown in FIG. 1A.
Figure 11B:
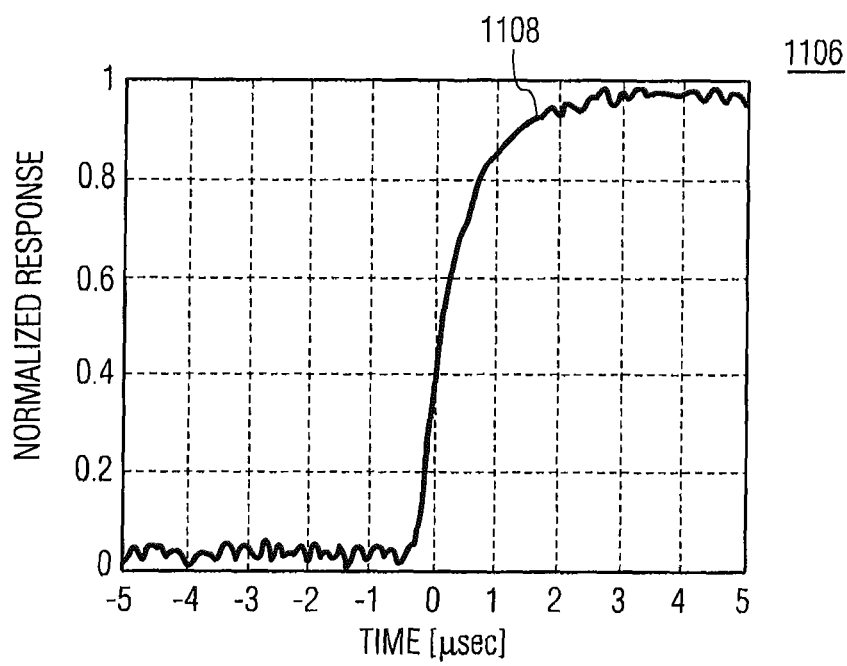
FIG. 11B is a graph of a portion of the normalized switch response shown in FIG. 11A.

Referring to FIGS. 11A and 11B, normalized switch response 1102 and actuation signal 1104 as a function of time are shown. Normalized response 1102 is a response of an exemplary piezoelectric switch to an AC test signal 1104 at 40 Hz. FIG. 11B is a graph of normalized switch response 1108 for portion 1106 of the normalized switch response 1102 shown FIG. 11A. As shown in FIG. 11B, normalized switch response 1108 illustrates a switching time of about 1-2 μs.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method for operating a piezoelectric switch, the piezoelectric switch comprising a first actuator and a second actuator, the first actuator including a first body electrode, a first gate electrode, and a first contact region, the second actuator including a second body electrode, a second gate electrode, and a second contact region, the first and second contact regions separated by a gap, the method comprising the steps of:

applying a bias voltage to the first and second body electrodes, the bias voltage lower in magnitude than an actuation voltage for the piezoelectric switch; and receiving a switching voltage at the first and second gate electrodes, the switching voltage causing at least one of the first and second actuators to bend, thereby closing the gap such that the second contact region electrically contacts the first contact region of the first actuator, wherein a difference between the switching voltage and the bias voltage exceeds the actuation voltage of the switch, and wherein the switching voltage is between approximately 100 μV and approximately 500 mV.

2. The method of claim 1, wherein the switching voltage is less than the actuation voltage.

3. The method of claim 1, wherein the receipt of the switching voltage causes both of the first and second actuators to bend.

4. The method of claim 1, wherein the application of the bias voltage causes at least one of the first and second actuators to bend, thereby narrowing but not closing the gap between the first and second contact regions.

5. The method of claim 4, wherein the application of the bias voltage causes both of the first and second actuators to bend.

6. A method for operating a piezoelectric switch, the piezoelectric switch comprising a first actuator and a second actuator, the first actuator including a first body electrode, a first gate electrode, and a first contact region, the second actuator including a second body electrode, a second gate electrode, and a second contact region, the first and second contact regions separated by a gap, the method comprising the steps of:

applying a bias voltage to the first and second body electrodes, the bias voltage lower in magnitude than an actuation voltage for the piezoelectric switch; and receiving a switching voltage at the first and second gate electrodes, the switching voltage causing at least one of the first and second actuators to bend, thereby closing the gap such that the second contact region electrically contacts the first contact region of the first actuator, wherein a difference between the switching voltage and the bias voltage exceeds the actuation voltage of the switch, and wherein the first contact region comprises a contact pad, the second contact region comprises a projection, the first actuator further includes a source electrode in electrical contact with the contact pad, the second actuator further includes a drain electrode in electrical contact with the projection, and the switching voltage causes at least one of the first and second actuators to bend, thereby closing the gap such that the drain electrode of the second actuator is electrically connected with the source electrode of the first actuator.

7. A method for operating a piezoelectric switch, the piezoelectric switch comprising a first actuator and a second actuator, the first actuator including a first body electrode, a first gate electrode, and a first contact region, the second actuator including a second body electrode, a second gate electrode, and a second contact region, the first and second contact regions separated by a gap, the method comprising the steps of:

applying a bias voltage to the first and second body electrodes, the bias voltage lower in magnitude than an actuation voltage for the piezoelectric switch; and receiving a switching voltage at the first and second gate electrodes, the switching voltage causing at least one of the first and second actuators to bend, thereby closing the gap such that the second contact region electrically contacts the first contact region of the first actuator, wherein a difference between the switching voltage and the bias voltage exceeds the actuation voltage of the switch, and wherein the first actuator comprises a pair of gate electrodes sandwiching the first body electrode, the first body electrode separated from each of the pair of gate electrodes by a respective layer of piezoelectric material; and the second actuator comprises a pair of body electrodes sandwiching the second gate electrode, the second gate electrode separated from each of the pair of body electrodes by a respective layer of piezoelectric material.

* * * * *